(12) United States Patent
Kawaji et al.

(10) Patent No.: US 7,423,316 B2
(45) Date of Patent: Sep. 9, 2008

(54) SEMICONDUCTOR DEVICES

(75) Inventors: Sachiko Kawaji, Owariasahi (JP);
Masayasu Ishiko, Nagoya (JP);
Takahide Sugiyama, Aichi-gun (JP);
Masanori Usui, Seto (JP); Jun Saito,
Toyota (JP); Koji Hotta, Nishikamo-gun
(JP)

(73) Assignees: Kabushiki Kaisha Toyota Chuo Kenkyusho, Aichi (JP); Toyota Jidosha Kabushiki Kaisha, Toyota (JP)

( * ) Notice: Subject to any disclaimer, the term of this patent is extended or adjusted under 35 U.S.C. 154(b) by 34 days.

(21) Appl. No.: 11/596,063

(22) PCT Filed: May 12, 2005

(86) PCT No.: PCT/JP2005/008717

§ 371 (c)(1),
(2), (4) Date: Nov. 9, 2006

(87) PCT Pub. No.: WO2005/109521

PCT Pub. Date: Nov. 17, 2005

(65) Prior Publication Data

US 2008/0012040 A1 Jan. 17, 2008

(30) Foreign Application Priority Data

May 12, 2004 (JP) .............................. 2004-141797

(51) Int. Cl.
*H01L 29/94* (2006.01)
(52) U.S. Cl. .................. 257/330; 257/332; 257/565; 257/E29.027; 257/E29.066
(58) Field of Classification Search ............. 257/330, 257/332, 565, E29.027, E29.066
See application file for complete search history.

(56) References Cited

U.S. PATENT DOCUMENTS

| 5,329,142 A | 7/1994 | Kitagawa et al. |
| 5,448,083 A | 9/1995 | Kitagawa et al. |

(Continued)

FOREIGN PATENT DOCUMENTS

| JP | A 05-243561 | 9/1993 |
| JP | A 07-050405 | 2/1995 |
| JP | A 2000-058833 | 2/2000 |
| JP | A 2000-353806 | 12/2000 |

(Continued)

OTHER PUBLICATIONS

Shekar et al.; "Trench Gate Emitter Switched Thyristors;" Proc. Of the 6th Internat. Symposium on Power Semiconductor Devices & IC's; Session 5: Thyristors 2; pp. 189-194; Davos, Switzerland; May 31-Jun. 2, 1994.

*Primary Examiner*—Evan Pert
*Assistant Examiner*—Tan N Tran
(74) *Attorney, Agent, or Firm*—Oliff & Berridge, PLC

(57) ABSTRACT

The dense accumulation of hole carriers can be obtained over a wide range of a semiconductor region in a floating state formed within a body region of an IGBT. An n type semiconductor region (52) whose potential is floating is formed within a p⁻ type body region (28). The n type semiconductor region (52) is isolated from an n⁺ type emitter region (32) and an n⁻ type drift region (26) by the body region (28). Furthermore, a second electrode (62) is formed, so as to oppose to at least a part of the semiconductor region (52) via an insulator film (64). The second electrode (62) does not oppose to the emitter region (32).

8 Claims, 14 Drawing Sheets

U.S. PATENT DOCUMENTS

| | | |
|---|---|---|
| 5,585,651 A | 12/1996 | Kitagawa et al. |
| 5,689,121 A | 11/1997 | Kitagawa et al. |
| 5,838,026 A | 11/1998 | Kitagawa et al. |
| 6,518,629 B1 | 2/2003 | Kushida et al. |
| 2002/0179976 A1 | 12/2002 | Takahashi |

FOREIGN PATENT DOCUMENTS

| | | |
|---|---|---|
| JP | A 2002-100770 | 4/2002 |
| JP | A 2002-190595 | 7/2002 |
| WO | WO 01/18876 A1 | 3/2001 |
| WO | WO 2005/062385 A1 | 7/2005 |
| WO | WO 2005/109521 A1 | 11/2005 |

SEMICONDUCTOR DEVICES

TECHNICAL FIELD

The present application claims priority based on Japanese Patent Application 2004-141797 filed on May 12, 2004, the contents of which are hereby incorporated by reference within this application.

The present invention relates to a technique for reducing on-voltage of an IGBT (Insulated Gate Bipolar Transistor). In particular, the present invention relates to a technique for reducing on-voltage of the IGBT while maintaining a saturation current of the IGBT at a low level.

BACKGROUND ART

An IGBT comprises an emitter region of a first conductive type, a drift region of the first conductive type, and a body region of a second conductive type separating the emitter region and the drift region. A technique is proposed for reducing on-voltage of the IGBT by providing a semiconductor region of the first conductive type within the body region of the second conductive type. This technique is disclosed in: Proc. of the 6th internat. Symposium on Power Semiconductor Devices & IC's, Davos, Switzerland. 1994. "Trench Gate Emitter Switched Thyristors" M. S. Shekar, J. Korec, B. J. Baliga. p 189-194. IEEE Cat. no. 94CH3377-9.

FIG. 16 (a) schematically shows a cross-sectional view of essential parts of an IGBT 100 disclosed in the above document. The IGBT 100 comprises $n^+$ type emitter regions 132, a $p^-$ type body region 128 making contact with the emitter regions 132, and an $n^-$ type drift region 126 that makes contact with the body region 128 and is isolated from the emitter regions 132 by the body region 128. The IGBT 100 further comprises trench gate electrodes 142. The trench gate electrodes 142 pass through the body region 128 at portions separating the emitter regions 132 and the drift region 126, and extend from the emitter regions 132 to the drift region 126. The trench gate electrode 142 faces the body region 128 via a gate insulator film 144. The IGBT 100 further comprises an $n^+$ type semiconductor region 154 formed within the body region 128. The semiconductor region 154 is isolated from the emitter regions 132 by a body region 128a, and is also isolated from the drift region 126 by a body region 128b. The body region 128a and the body region 128b are connected to each other at a cross-sectional plane (not shown).

A $p^+$ type body contact region 134 is formed in a region between left and right emitter regions 132 at an upper part of the body region 128a. An $n^+$ type buffer region 124 and a $p^+$ type collector region 122 are formed in sequence below the drift region 126. The emitter regions 132 and the body contact region 134 are electrically connected to an emitter electrode E. The collector region 122 is electrically connected to a collector electrode C.

The IGBT 100 is characterized in comprising the semiconductor region 154 within the body region 128. The semiconductor region 154 extends from the gate insulator film 144 of one of the trench gate electrodes 142 to the gate insulator film 144 of the other of the trench gate electrodes 142. The semiconductor region 154 is also insulated from the emitter regions 132, the body regions 128a and 128b, and the drift region 126. The potential of the semiconductor region 154 is not determined directly by the potential applied to the IGBT 100, but fluctuates according to surrounding environment. This potential state is referred to as floating in the present specification.

When the emitter electrode E of the IGBT 100 is earthed, a positive voltage is applied to the collector electrode C, and a positive gate voltage is applied to the trench gate electrodes 142, portions of the body region 128 facing the trench gate electrodes 142 are inverted to the n type, and channel regions are formed. Electron carriers are supplied from the emitter regions 132, are injected into the drift region 126 via the channel regions that were inverted to the n type, and accumulate in the buffer region 124. When the electron carriers accumulate in the buffer region 124, there is a reduction of the contact potential difference of the buffer region 124 and the collector region 122. As a result, positive hole carriers are injected from the collector region 122 toward the buffer region 124 and the drift region 126, and electric conductivity modulation occurs.

The positive hole carriers that have been injected from the collector region 122 recombine with the electron carriers and disappear, or are emitted from the emitter electrode E via the body region 128 and the body contact region 134.

When the semiconductor region 154 is provided within the body region 128, a potential barrier is formed between the semiconductor region 154 and the body region 128b. This potential barrier obstructs the flow of the positive hole carriers that have been injected from the collector region 122. The positive hole carriers thus accumulate in the body region 128b and the drift region 126, and the on-voltage of the IGBT 100 decreases.

DISCLOSURE OF INVENTION

Problem to be Solved by the Invention

When the present inventors examined in more detail the phenomenon obtained by using the semiconductor region 154 that is in the floating state, they found the following phenomenon.

FIG. 16 (b) shows the distribution of positive hole carrier concentration accumulated along the line b-b' of FIG. 16 (a) (a boundary surface 129 between the semiconductor region 154 and the body region 128b). The vertical axis shows the positive hole carrier concentration, and the horizontal axis corresponds to the line b-b'. As is clear from FIG. 16 (b), the accumulation amount of the positive hole carriers is smaller in a location away from the facing trench gate electrodes 142. This is caused by the following reasons. The potential of the trench gate electrodes 142 has an ability to increase the potential of the semiconductor region 154 that is in the floating state. This ability is decreased at the location away from the trench gate electrodes 142. Therefore the potential of the semiconductor region 154 is high at portions close to the trench gate electrodes 142 and low at a portion away from the trench gate electrodes 142. The potential difference between the semiconductor region 154 and the body region 128 becomes small at the portion away from the trench gate electrodes 142. As a result, the positive hole carrier accumulation ability of the conventional semiconductor region 154 is lowered at the portion away from the trench gate electrodes 142.

It could be thought that the above phenomenon could be overcome effectively by decreasing the space (also termed pitch width) between facing trench gate electrodes 142. However, decreasing the space between facing trench gate electrodes 142 leads to an increase in the area occupied by the emitter regions 132 on the surface of the semiconductor substrate, and there is consequently an increase in the ability of the emitter regions 132 to supply electron carriers. The present inventors found from their research that there is consequently the new problem of the saturation current of the IGBT increasing, and the IGBT can readily be destroyed. Examining this phenomenon, the present inventors discovered that it is important to increase the positive carrier accumulation ability of the semiconductor region 154 without increasing the area of the emitter regions 132.

The present invention aims to decrease the on-voltage of an IGBT while increasing the carrier accumulation ability across a wide range of the semiconductor region in the floating state.

Means to Solve the Problem

A plurality of IGBTs that were created on the basis of the above information are proposed in the present invention. Any of these IGBTs can overcome the common problem of reducing the on-voltage while maintaining the saturation current at a low level.

The IGBT of the present invention comprises an emitter region of a first conductive type, a body region of a second conductive type which makes contact with the emitter region of the first conductive type, and a drift region of the first conductive type which makes contact with the body region of the second conductive type. The drift region is isolated from the emitter region of the first conductive type by the body region of the second conductive type. The IGBT further comprises a gate electrode. The gate electrode faces the body region of the second conductive type via a gate insulator film, and passes through the body region of the second conductive type at a separating the emitter region of the first conductive type and the drift region of the first conductive type. The gate electrode extends from the emitter region of the first conductive type to the drift region of the first conductive type.

The IGBT of the present invention comprises, in addition to the above, a semiconductor region of the first conductive type and a second electrode. The semiconductor region of the first conductive type is formed within the body region of the second conductive type and is isolated from both the emitter region of the first conductive type and the drift region of the first conductive type by the body region of the second conductive type. The potential of the semiconductor region of the first conductive type is in a floating state. The second electrode faces at least a part of the semiconductor region of the first conductive type via an insulator film, and is far from the emitter region of the first conductive type. That is, the second electrode does not form an inverted layer in the body region of the second conductive type at a portion separating the semiconductor region of the first conductive type and the emitter region of the first conductive type.

The semiconductor region of the first conductive type may make contact with the gate insulator film of the gate electrode, or may be formed separate therefrom.

In the case of the aforementioned IGBT, the potential of the semiconductor region of the first conductive type opposite the second electrode can be increased when a predetermined voltage is applied to the second electrode. A potential difference between the semiconductor region of the first conductive type and the body region of the second conductive type becomes greater when the potential of the semiconductor region of the first conductive type increases, and a potential barrier with respect to carriers of the second conductive type is formed. The potential barrier obstructs the flow of the carriers of the second conductive type. The carriers of the second conductive type can consequently accumulate along a wide range of the body region of the second conductive type that is present between the semiconductor region of the first conductive type and the drift region of the first conductive type, and the on-voltage of the IGBT can be reduced. Moreover, it is preferred that a plurality of second electrodes is distributed between facing gate electrodes, as consequently the potential of the semiconductor region of the first conductive type can be increased across the wide range. When a plurality of the second electrodes is distributed between facing gate electrodes, the potential of the semiconductor region of the first conductive type can be increased in a well-balanced manner across the wide range.

Furthermore, in the aforementioned IGBT, the second electrodes do not make contact with the emitter region of the first conductive type. That is, the second electrodes do not form an inverted layer in the body region of the second conductive type at a portion separating the semiconductor region of the first conductive type and the emitter region of the first conductive type. As a result, carriers of the first conductive type are not supplied along the second electrodes. The situation in which the IGBT can readily be destroyed due to an increase in the saturation current can consequently be prevented. With the present invention, the on-voltage of the IGBT can be reduced due to the increase in the accumulation amount of the carriers of the second conductive type while the destruction of the IGBT due to an increase in the saturation current is simultaneously being prevented.

The 'carriers of the first conductive type' in the present specification refers to 'carriers in a semiconductor of the first conductive type.' Similarly, 'carriers of the second conductive type' in the present specification refers to 'carriers in a semiconductor of the second conductive type.' For example, in the case where the first conductive type is n type, the carriers of the first conductive type are electron carriers, and the carriers of the second conductive type are positive holes.

It is preferred that the floating semiconductor region of the first conductive type makes contact with the gate insulator film.

When the semiconductor region of the first conductive type makes contact with the gate insulator film, the carriers of the first conductive type supplied from the emitter region along the channel region are diffused within the semiconductor region of the first conductive type. The carriers of the first conductive type diffused within the semiconductor region of the first conductive type are injected in a planar manner toward the body region and the drift region utilizing the semiconductor region of the first conductive type (there is an increase in the current path line). The on-voltage of the IGBT can thus be reduced further.

It is preferred that the second electrode passes through the body region of the second conductive type at a portion separating the semiconductor region of the first conductive type and the drift region of the first conductive type. The second electrode may extend from the semiconductor region of the first conductive type to the drift region of the first conductive type, and may face the body region of the second conductive type via the insulator film.

When voltage is applied to the second electrode, the location in the body region of the second conductive type, where the second electrode faces, can be inverted. This location of the body region isolates the semiconductor region of the first conductive type and the drift region of the first conductive type before the location is inverted. As a result, the carriers of the first conductive type that are diffused within the semiconductor region of the first conductive type are easily injected toward the drift region of the first conductive type along the inverted channel region. The on-voltage of the IGBT can thus be reduced further.

In the case where a plurality of the second electrodes is distributed, only one of the second electrodes may pass through the body region separating the semiconductor region of the first conductive type and the drift region of the first conductive type. In this case, also, the effects described above can be realized.

With the IGBT of the present invention, a large amount of carriers of the second conductive type can be accumulated utilizing the semiconductor region of the first conductive type. Furthermore, the semiconductor region of the first conductive type makes contact with the gate insulator film, and consequently a greater amount of the carriers of the second conductive type can be accumulated in response to the diffusion of the carriers of the first conductive type within the semiconductor region of the first conductive type (the current path line). With these synergistic effects, with the IGBT of the present invention, the carriers of the second conductive type can be accumulated in an amount that cannot be realized with the conventional configuration.

That is, the IGBT of the present invention can have the following characteristic. When the IGBT of the present invention is turned on, the concentration of carriers of the second conductive type accumulated at a boundary surface is $8 \times 10^{15}$ $cm^{-3}$ or greater. This boundary surface is one of boundary surfaces between the semiconductor region of the first conductive type and the body region of the second conductive type, and located at a side facing the drift region of the first conductive type.

It is preferred that the second electrode and the gate electrode are electrically connected.

In this case, voltage is also applied to the second electrode when on-voltage is applied to the gate electrode. The effect can be obtained wherein carriers of the second conductive type are accumulated utilizing the potential of the semiconductor region of the first conductive type while the IGBT is on.

In this case, a separate voltage supply source does not need to be provided for the second electrode, and consequently the configuration can be simplified.

It is preferred that the impurity concentration of the semiconductor region of the first conductive type is $1 \times 10^{17}$ $cm^{-3}$ or less.

The latch up phenomenon can be controlled when the impurity concentration of the semiconductor region of the first conductive type is low. The latch up phenomenon is a phenomenon in which carriers of the second conductive type that have accumulated excessively are discharged via the emitter region of the first conductive type, making the turn off of the IGBT unstable. In the present invention, the second electrode is provided, and consequently the carriers of the second conductive type can be accumulated in a well-balanced manner in spite of the semiconductor region of the first conductive type having a low impurity concentration. In the present invention, the on-voltage can be reduced utilizing the second electrode while the excessive accumulation of carriers of the second conductive type is prevented using the semiconductor region of the first conductive type that has a low impurity concentration. In the present invention, therefore, stable turn off and low on-voltage can be obtained.

Furthermore, the phenomenon is marked whereby, the lower the impurity concentration of the semiconductor region of the first conductive type, the greater the reduction of the accumulation amount of the carriers of the second conductive type at a location removed from the gate electrode. However, in the IGBT of the present invention, since the second electrode is formed, the carriers of the second conductive type can be accumulated using the semiconductor region of the first conductive type even in the case where the impurity concentration of this semiconductor region of the first conductive type is $1 \times 10^{17}$ $cm^{-3}$ or less. The present invention can thus be judged to have particular utility in the case where the impurity concentration of the semiconductor region of the first conductive type is $1 \times 10^{17}$ $cm^{-3}$ or less.

The impurity concentration of the semiconductor region of the first conductive type may vary within a plane orthogonal to a direction extending from the emitter region of the first conductive type towards the drift region of the first conductive type.

By providing a part in the semiconductor region of the first conductive type in which the impurity concentration is low, it is possible to rapidly discharge the accumulated carriers of the second conductive type utilizing the low concentration part when the IGBT turned off. The turn off characteristics of the IGBT can thus be improved.

In the case where the impurity concentration of the semiconductor region of the first conductive type varies within the plane, it is preferred that a high impurity concentration part of the semiconductor region of the first conductive type is located between the emitter region of the first conductive type and the drift region. Further, it is preferred that a low impurity concentration part of the semiconductor region of the first conductive type is located between the drift region of the first conductive type and a surface of the body region of the second conductive type wherein the emitter region of the first conductive type is not formed.

When the high impurity concentration part and the low impurity concentration part have the aforementioned positional relationship, the carriers of the second conductive type to be discharged through the low impurity concentration part do not flow into the emitter region of the first conductive type, and are rapidly discharged to a main electrode provided on the surface. As a result, the turn off characteristics of the IGBT can be improved while preventing the occurrence of the latch up phenomenon.

By restricting the area of the emitter region of the first conductive type, the present inventors also have created an IGBT in which the on-voltage can be reduced while maintaining the saturation current of the IGBT at low level.

That is, another IGBT of the present invention comprises emitter regions of a first conductive type, a body region of a second conductive, the body region making contact with the emitter regions of the first conductive type, and a drift region of the first conductive type, the drift region making contact with the body region of the second conductive type and being isolated from the emitter regions of the first conductive type by the body region of the second conductive type. The other IGBT of the present invention further comprises gate electrodes. The gate electrodes face the body region of the second conductive type via gate insulator films, and the gate electrodes pass through the body region of the second conductive type at portions separating the emitter regions of the first conductive type and the drift region of the first conductive type. The gate electrodes extend from the emitter regions of the first conductive type to the drift region of the first conductive type. In addition to the above, the other IGBT of the present invention comprises a semiconductor region of the first conductive type. The semiconductor region of the first conductive type is formed within the body region of the second conductive type and is isolated from both the emitter regions of the first conductive type and the drift region of the first conductive type by the body region of the second conductive type. The potential of the semiconductor region of the first conductive type is at a floating state. The semiconductor region of the first conductive type may make contact with the gate insulator film of the gate electrode, or may be formed separate therefrom.

The other IGBT of the present invention has a feature that the emitter regions of the first conductive type make contact with the gate insulator film at discrete interval within a surface of a semiconductor substrate.

By providing the emitter regions of the first conductive type at discrete interval, the pitch width of the gate electrodes can be adjusted without increasing the area that the emitter regions of the first conductive type occupy on the surface of the semiconductor substrate. The area that the emitter regions of the first conductive type occupy on the surface of the semiconductor substrate can be maintained at a predetermined amount even if the pitch width of the gate electrodes has been adjusted to be narrower. Consequently the pitch width of the gate electrodes can be adjusted to be narrower without increasing the area of the emitter regions of the first conductive type. As a result, the semiconductor region of the second conductive type can thus have an increase in its accumulation capacity for the carriers of the second conductive type without there being an increase in the amount of carriers of the first conductive type supplied from the emitter regions of the first conductive type. In the present invention, by using the combination of the simple configuration of providing the emitter regions of the first conductive type at discrete interval, together with the configuration in which the semiconductor region of the first conductive type is provided within the body region, an IGBT can be obtained in which there is a superior reduction in the on-voltage while maintaining the saturation current at the low level. The present inventors found, based on new knowledge, that providing the emitter regions of the first conductive type at discrete interval is extremely effective in the case of the IGBT that utilizes the semiconductor region of the first conductive type that has a floating potential.

It is preferred that, in another IGBT of the present invention, the semiconductor region of the first conductive type that has a floating potential makes contact with the gate insulator film.

When the semiconductor region of the first conductive type makes contact with the gate insulator film, the carriers of the first conductive type supplied from the emitter regions via the channel regions are diffused within the semiconductor region of the first conductive type. The carriers of the first conductive type diffused within the semiconductor region of the first conductive type are injected in a planar manner utilizing the semiconductor region of the first conductive type toward the body region and the drift region. The on-voltage of the IGBT can thus be reduced further.

It is preferred that, in another IGBT of the present invention, the emitter regions of the first conductive type are formed between facing gate electrodes, and make contact with the gate insulator film of one of the gate electrodes do not make contact with the gate insulator film of the other of the gate electrodes in a direction orthogonal to a plane in which the gate insulator film and the emitter regions of the first conductive type make contact.

In the IGBT provided with the emitter regions of the first conductive type having the above configuration, the carriers of the first conductive type supplied from the emitter regions of the first conductive type flow along the following path to the drift region of the first conductive type. First, the carriers of the first conductive type supplied from the emitter regions of the first conductive type flow along the gate insulator film to the semiconductor region of the first conductive type. Here, a portion of the carriers of the first conductive type passes through the semiconductor region of the first conductive type, and flows along the gate insulator film to the drift region of the first conductive type (in the present specification, this path is termed the first channel). The other portion of the carriers of the first conductive type diffuses within the semiconductor region of the first conductive type and flows along the gate insulator film of the facing gate electrode to the drift region of the first conductive type (in the present specification, this path is termed the second channel). That is, although the amount of carriers of the first conductive type supplied is controlled by the area of the emitter regions of the first conductive type that has a restricted area, the supplied carriers of the first conductive type can flow across a wide range utilizing the semiconductor region of the first conductive type and the facing gate electrodes. Channel resistance tends to increase when the emitter regions are formed at discrete interval. However, the two channels can be utilized in the aforementioned configuration, and consequently the increase in channel resistance can be controlled. It is possible, while the supplied carriers of the first conductive type are flowing, to keep channel resistance low while maintaining a large channel area while simultaneously the amount of carriers of the first conductive type supplied from the emitter regions is restricted and the saturation current is kept at a low level.

It is preferred that, to use the flow of the carriers of the first conductive type effectively, the emitter regions of the first conductive type are formed between facing gate electrodes, a first set of the emitter regions making contact with the gate insulator film of one of the gate electrodes are formed repeatedly at discrete interval, a second set of the emitter regions making contact with the gate insulator film of the other of the gate electrodes are formed repeatedly at discrete interval, and the first set of the emitter regions of the first conductive type alternates with the second set of the emitter regions of the first conductive type along a line in which the first set of the emitter regions are aligned at discrete interval. In this case, the pattern of the emitter regions of the first conductive type on the surface of the semiconductor substrate could also be termed a lattice shape (or checkered shape) between facing gate electrodes. When this configuration is adopted, the combination of the first channel and the second channel is distributed in a well-balanced manner across the entire semiconductor substrate (there is an increase in the current path lines), and this is effective in reducing on-voltage. As a result, channel resistance can be reduced markedly while the destruction of the IGBT based on the increase in the saturation current is being prevented, and consequently an IGBT with markedly reduced on-voltage can be obtained.

In the IGBT provided with the emitter regions of the first conductive type at discrete intervals, also, there are synergistic effects between the accumulation of carriers of the second conductive type caused by the potential barrier formed at the boundary surface of the semiconductor region of the first conductive type and the body region of the second conductive type, and the accumulation of carriers of the second conductive type in response to the diffusion of carriers of the first conductive type across the semiconductor region of the first conductive type. As a result, the carriers of the second conductive type can be accumulated in an amount that cannot be realized with the conventional configuration.

That is, the IGBT of the present invention can have the characteristic that, when the IGBT is on, concentration of carriers of the second conductive type accumulated at a boundary surface is $8 \times 10^{15}$ cm$^{-3}$ or greater, this boundary surface being, within boundary surfaces between the semiconductor region of the first conductive type and the body region, located at a side facing the drift region.

It is preferred that the emitter regions of the first conductive type making contact with the gate insulator film at discrete interval are connected each other at locations where the emitter regions do not make contact with the gate insulator film.

Parts of the emitter regions of the first conductive type that do not make contact with the gate insulator film do not critically increase the supply amount of the carriers of the first conductive type and, instead, the contact resistance with main electrode provided on the surface can be reduced. As a result, it is preferred that the portions of the emitter regions of the first conductive type not making contact with the gate insulator films maintain a size within a range in which the supply amount of the carriers of the first conductive type is not critically increased. It is consequently preferred that the emitter regions of the first conductive type are connected each other at positions that do not make contact with the gate insulator films. Here, 'connect' includes the case where the emitter regions of the first conductive type are connected via another semiconductor region of the first conductive type. The contact resistance can thus be reduced, and on-voltage can consequently be reduced.

It is preferred that the area of the emitter regions of the first conductive type exposed at a surface of the semiconductor substrate is 50% or less of the area of the semiconductor region of the first conductive type within a plane orthogonal to a direction extending from the emitter region of the first conductive type towards the drift region of the first conductive type.

When the area of the emitter regions of the first conductive type is adjusted to be within the above range, an IGBT can be realized in which destruction caused by the saturation current can be prevented, and in which on-voltage is extremely small.

It is preferred that the impurity concentration of the semiconductor region of the first conductive type is $1 \times 10^{17}$ cm$^{-3}$ or less.

The occurrence of the latch up phenomenon can thus be prevented, while the carriers of the second conductive type can be accumulated utilizing the semiconductor region of the first conductive type.

It is preferred that the impurity concentration of the semiconductor region of the first conductive type varies within a plane orthogonal to a direction extending from the emitter region of the first conductive type towards the drift region of the first conductive type.

By providing a part where the impurity concentration of the semiconductor region of the first conductive type is adjusted to be lower, the accumulated carriers of the second conductive type can be discharged rapidly through the part when the IGBT turned off. As a result, the turn off characteristic of the IGBT can be improved.

It is preferred that, in the case where the impurity concentration of the semiconductor region of the first conductive type varies within a plane, a high impurity concentration part of the semiconductor region of the first conductive type is located between the emitter region of the first conductive type and the drift region. Furthermore, it is preferred that a low impurity concentration part of the semiconductor region of the first conductive type is located between the drift region of the first conductive type and a surface of the body region of the second conductive type wherein the emitter region of the first conductive type is not formed.

When the high impurity concentration part and the low impurity concentration part have the above positional relationship, the carriers of the second conductive type to be discharged through the low impurity concentration part do not flow into the emitter regions of the first conductive type, and are discharged rapidly to the main electrode provided on the surface when the IGBT has been turned off. As a result, the turn off characteristic of the IGBT can be improved while the latch up phenomenon is prevented.

EFFECTS OF THE INVENTION

With the present invention, a wide range of the semiconductor region of the first conductive type that is in a floating state can be used and carriers of the second conductive type can be accumulated. The on-voltage of the IGBT can be reduced.

BRIEF DESCRIPTION OF THE DRAWINGS

FIG. 1 (b) shows the distribution of concentration of positive hole carriers corresponding to the line b-b' of FIG. 1 (a).

FIG. 16 (b) shows the distribution of concentration of positive hole carriers corresponding to the line b-b' of FIG. 16 (a).

BEST FEATURES FOR CARRYING OUT THE INVENTION

Figure 1:
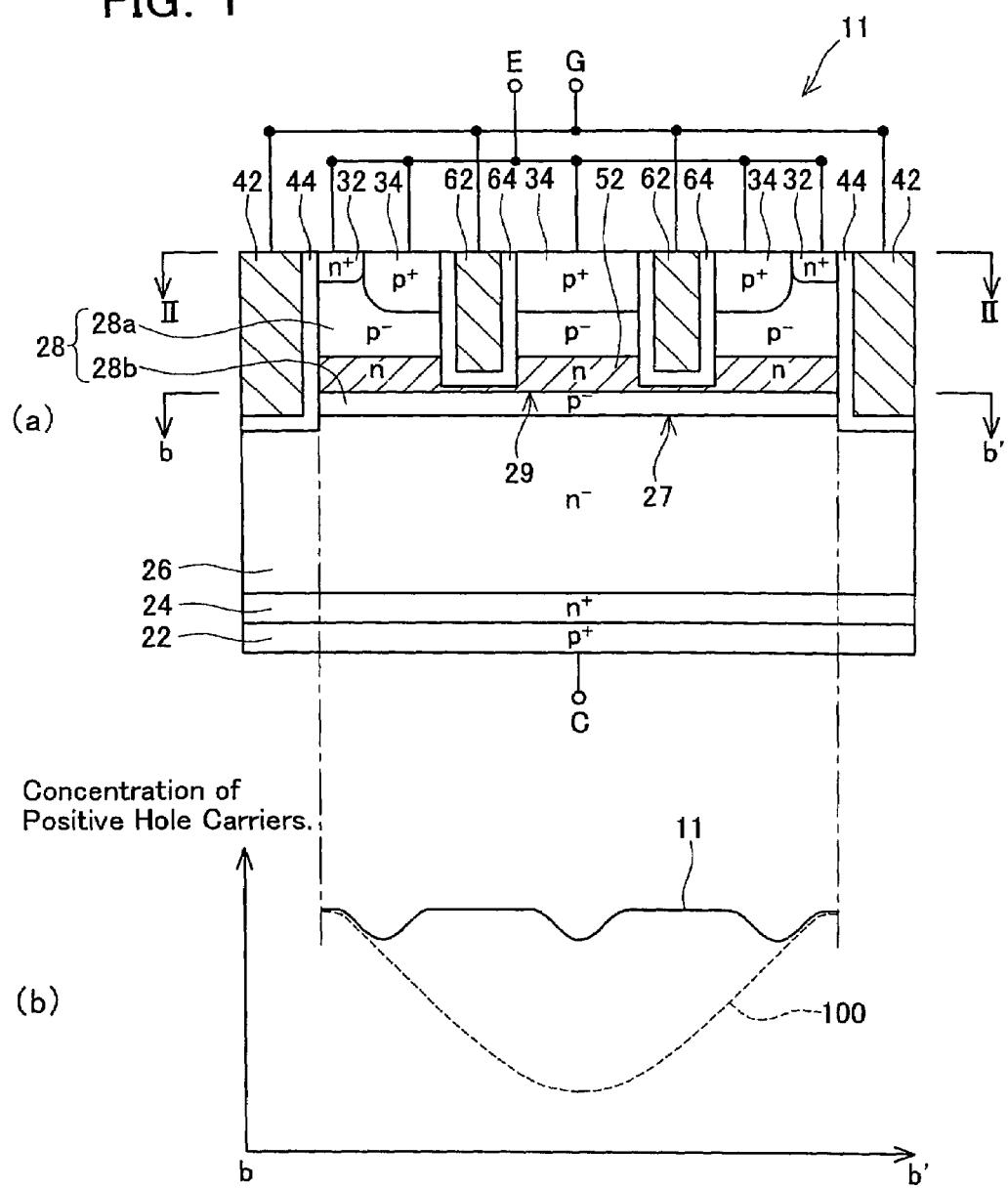
FIG. 1 (a) schematically shows a cross-sectional view of essential parts of an IGBT of a first embodiment.

First, several features of the embodiments will be listed.

(First feature) An IGBT comprises a collector region of a second conductive type (for example, p$^+$ type), a drift region of a first conductive type (for example, n$^-$ type) formed on the collector region, a body region of the second conductive type (for example, p$^-$ type) formed on the drift region, an emitter region of the first conductive type (for example, n$^+$ type) formed selectively on a surface of the body region, a body contact region of the second conductive type (for example, p$^+$ type) formed selectively on the surface of the body region, and a trench gate electrode that faces, via a gate insulator film, the body region at a portion separating the emitter region and the drift region, wherein a semiconductor region of the first conductive type (for example, n type) having a floating potential is formed within the body region, and an electrode facing the floating semiconductor region extends from a surface of the body contact region to the floating semiconductor region and is covered by an insulator film.

(Second feature) The electrode facing the floating semiconductor region extends to the drift region. Utilizing a bottom surface of the electrode facing the floating region, carriers can accumulate in the drift region near a boundary surface between the body region and the drift region.

(Third feature) An IGBT comprises a collector region of a second conductive type (for example, $p^+$ type), a drift region of a first conductive type (for example, $n^-$ type) formed on the collector region, a body region of the second conductive type (for example, $p^-$ type) formed on the drift region, an emitter region of the first conductive type (for example, $n^+$ type) formed selectively on a surface of the body region, a body contact region of the second conductive type (for example, $p^+$ type) formed selectively on the surface of the body region, and a trench gate electrode that faces, via a gate insulator film, the body region at a portion separating the emitter region and the drift region, wherein a semiconductor region of the first conductive type (for example, n type) having a floating potential is formed within the body region, and emitter regions are formed at disparate interval in the direction in which a gate electrode of the surface of the body region extends.

(Fourth feature) It is preferred that, in the IGBT of the third feature, the width of the interval between adjacent emitter regions is adjusted to be within the range 1 µm to 10 µm.

(Fifth feature) It is preferred that, in the IGBT of the third feature, the depth of the emitter regions is adjusted to be within the range 0.1 µm to 1 µm.

(Sixth feature) It is preferred that, in the IGBT of the third feature, the thickness of the floating semiconductor region of the first conductive type is adjusted to be within the range 0.1 µm to 1 µm. The effect of accumulating second conductive type carriers (for example, positive holes) can be obtained. It is more preferred that the thickness of the semiconductor region is adjusted to be within the range 0.3 µm to 0.5 µm. Outstanding accumulation of the second conductive type carriers can thereby be obtained, and turn off characteristics are also excellent.

(Seventh feature) It is preferred that, in the IGBT of the third feature, the depth of the body region is 4.5 µm to 5.0 µm, the depth of the gate electrode is approximately 5.5 µm, and the thickness of the drift region is 100 µm or greater.

EMBODIMENTS

Embodiments will be described in detail below with reference to the figures. The IGBT semiconductor material used in the descriptions below is chiefly silicon material. The same operations and effects can be obtained using other semiconductor materials instead of the silicon material, such as silicon carbide, gallium arsenide, gallium nitride, etc.

First Embodiment

FIG. 1 (a) schematically shows a cross-sectional view of essential parts of an IGBT 11 of a first embodiment.

The IGBT 11 comprises emitter regions 32 of a first conductive type ($n^+$ type), a body region 28 of a second conductive type ($p^-$ type) making contact with the emitter regions 32, and a drift region 26 of the first conductive type ($n^-$ type) that makes contact with the body region 28 and is isolated from the emitter regions 32 by the body region 28. The IGBT 11 further comprises trench gate electrodes 42. The trench gate electrodes 42 pass through the body region 28 at portions separating the emitter regions 32 and the drift region 26, and extend from the emitter regions 32 to the drift region 26. The trench gate electrodes 42 face the body region 28 via gate insulator films 44. Polysilicon, for example, may be utilized as the material of the trench gate electrodes 42. The trench gate electrodes 42 are covered by a silicon oxide gate insulating film 44. The body region 28 facing the trench gate electrodes 42 via the gate insulating films 44 forms a channel region. The plan pattern of the trench gate electrodes 42 is a striped shape.

The following are formed in sequence under the drift region 26: a first buffer region 24 of the first conductive type ($n^+$ type), and a collector region 22 of the second conductive type ($p^+$ type). The collector region 22 is electrically connected to a collector electrode C. Furthermore, the buffer region 24 may be omitted from this configuration.

Body contact regions 34 of the second conductive type ($p^+$ type) are formed in an upper portion of a body region 28a in a region to the left and right sides of the emitter regions 32. The emitter regions 32 and the body contact regions 34 are electrically connected to an emitter electrode E. The body region 28, emitter regions 32, and body contact regions 34 are formed at a surface part of the semiconductor substrate by, for example, the ion injection method.

The IGBT 11 comprises a semiconductor region 52 of the first conductive type (n type) formed within the body region 28. The semiconductor region 52 is isolated from the emitter regions 32 by the body region 28a, and is also isolated from the drift region 26 by a body region 28b. Further, the semiconductor region 52 is isolated from the trench gate electrodes 42 by the gate insulating films 44, and the potential thereof has a floating state. The semiconductor region 52 can be formed by, for example, the epitaxial growth technique, the ion injection technique, etc. The body region 28a and the body region 28b are connected together at a cross-sectional plane (not shown).

Figure 2:
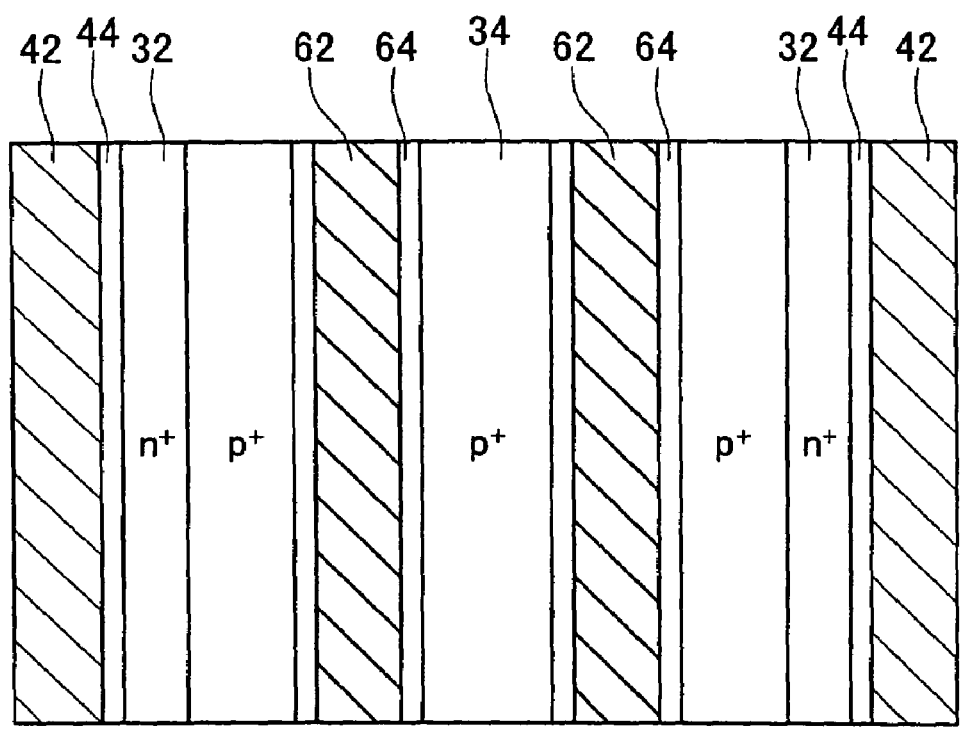
FIG. 2 shows a plan surface pattern of the first embodiment.

Moreover, the IGBT 11 comprises second electrodes 62 that pass through the body contact regions 34 and the body region 28a and reach the semiconductor region 52 of the first conductive type. Two second electrodes 62 are formed between facing trench gate electrodes 42. FIG. 2 shows a cross-sectional plane corresponding to the line II-II of FIG. 1. FIG. 2 shows the plan pattern of the surface structure of the IGBT 11. As shown in FIG. 2, the plan pattern of the second electrodes 62 is a striped shape extending parallel to the trench gate electrodes 42.

As shown in FIG. 1, the second electrodes 62 face at least a part of the semiconductor region 52 via an insulator film 64. The second electrodes 62 are far from the emitter regions 32, and do not make contact with these emitter regions 32. The second electrodes 62 face the part of the body region 28a that separates the body contact regions 34 and the semiconductor region 52. The second electrodes 62 can be considered to not be facing the part of the body region 28 that separates the emitter regions 32 and the semiconductor region 52.

Polysilicon is utilized as the material for the second electrodes 62, and the second electrodes 62 are covered by the insulator films 64 consisting of silicon oxide. The second electrodes 62 face the semiconductor region 52 that is at a floating state via the insulator films 64. The second electrodes 62 are electrically connected to the trench gate electrodes 42 along a cross-sectional plane (not shown), and are regulated by a common gate potential. The second electrodes 62 do not reach a bottom surface of the semiconductor region 52. As a result, the semiconductor region 52 is continuous in the left-right direction relative to the plane of the paper.

The impurity concentration and the thickness of the semiconductor regions are adjusted to the following values. The impurity concentration of the collector region 22 is approximately $1\times10^{18}$ cm$^{-3}$, and the thickness is approximately 0.5 µm. The impurity concentration of the buffer region 24 is approximately $2\times10^{17}$ cm$^{-3}$, and the thickness is approximately 0.5 µm. The impurity concentration of the drift region 26 is approximately $1\times10^{14}$ cm$^{-3}$, and the thickness is approximately 130 µm. The impurity concentration of the body region 28b is approximately $1\times10^{16}$ cm$^{-3}$, and the thickness is approximately 2 µm. The impurity concentration of the semiconductor region 52 is approximately $4\times10^{16}$ cm$^{-3}$, and the thickness is approximately 0.5 µm. The impurity concentration of the body region 28a is approximately $2\times10^{17}$ cm$^{-3}$, and the thickness is approximately 2 µm. The impurity concentration of the emitter region 32 is approximately $1\times10^{20}$ cm$^{-3}$, and the thickness is approximately 0.5 µm. The impurity concentration of the body contact region 34 is approximately $1\times10^{20}$ cm$^{-3}$, and the thickness is approximately 0.7 µm.

When the emitter electrode E of the IGBT 11 is earthed, a positive voltage (350V) is applied to the collector electrode C, and a positive voltage (15V) is applied to the trench gate electrodes 42, whereupon portions of the body region 28 facing the trench gate electrodes 42 are inverted to n type. Electron carriers (carriers of the first conductive type) are injected from the emitter regions 32 toward the drift region 26 and the buffer region 24 along the channels that were inverted to n type. Meanwhile positive hole carriers (carriers of the second conductive type) are injected from the collector region 22 toward the buffer region 24 and the drift region 26, and conductivity modulation occurs.

When gate on-voltage is applied to the trench gate electrodes 42, the gate on-voltage is also applied to the second electrodes 62 that have a common potential (resistance may intervene, so that the voltage supplied may vary). Thereupon, the floating potential of the semiconductor region 52 facing the second electrodes 62 follows therewith and also increases. The increase in the floating potential creates a large potential difference in a boundary surface between the semiconductor region 52 and the body region 28, and a potential barrier with respect to the positive hole carriers is formed. As a result, the flow is obstructed of the positive hole carriers injected from the collector region 22.

Figure 16:
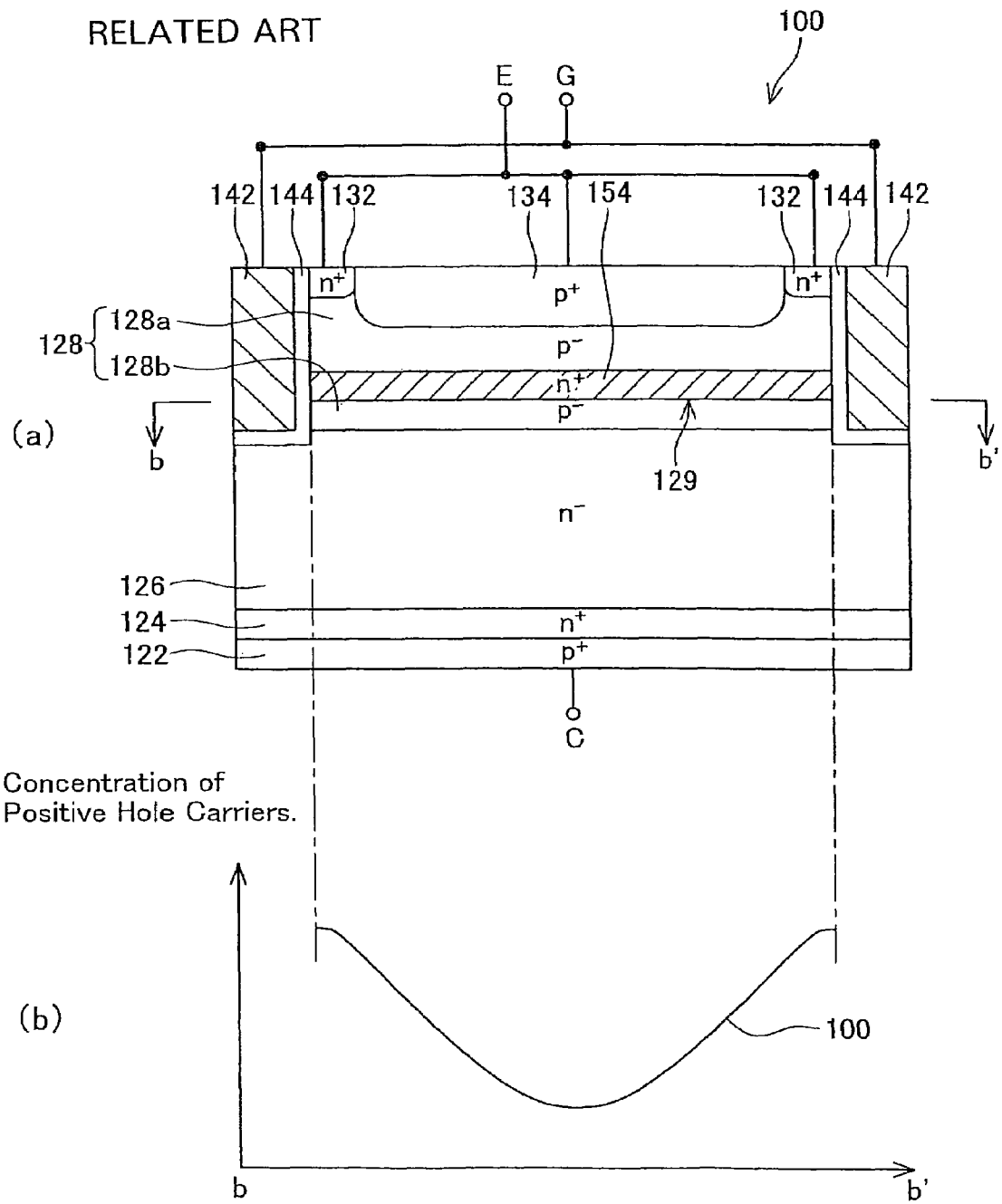
FIG. 16 (a) schematically shows a cross-sectional view of essential parts of a conventional IGBT.

FIG. 1 (b) shows the distribution of concentration of positive hole carriers accumulated along the line b-b' of FIG. 1 (a) (a boundary surface 29 between the semiconductor region 52 and the body region 28b). The vertical axis corresponds to the line b-b', and the horizontal axis corresponds to the concentration of positive hole carriers. Furthermore, the solid line 11 shows the distribution of concentration in the present embodiment, and the broken line 100 shows the distribution of concentration in the conventional configuration shown in FIG. 16.

It is clear from FIG. 1 (b) that the concentration of the positive hole carriers is the same along a wide range of the semiconductor region 52, and that the concentration of the positive hole carriers is much greater than with the conventional configuration. The on-voltage of the IGBT 11 is thus reduced. Further, in the present embodiment, the second electrodes 62 also have the effect of physically obstructing the flow of the positive hole carriers.

In the IGBT 11, the increase in the floating potential of the semiconductor region 52 enables the diffusion within the semiconductor region 52 of the electron carriers injected from the emitter regions 32. The electron carriers diffused in the semiconductor region 52 are thus injected in a planar manner, utilizing the semiconductor region 52, toward the body region 28b and the drift region 26, thus greatly reducing the on-voltage.

Further, the diffusion of the electron carriers in the semiconductor region 52 causes, in response to the electron carriers, a greater amount of the positive carriers to be accumulated at the boundary surface 29 between the semiconductor region 52 and the body region 28b. As a result, there are synergistic effects wherein the positive carriers accumulate based on the potential barrier formed at the boundary surface 29 between the semiconductor region 52 and the body region 28b, and the positive carriers accumulate in response to the diffusion of the electron carriers within the semiconductor region 52. As a result, the positive hole carriers can accumulate in an amount that cannot be realized with the conventional configuration. Specifically, when the IGBT 11 is on, the positive hole carriers accumulate at $8\times10^{15}$ cm$^{-3}$ or greater at the boundary surface 29 between the semiconductor region 52 and the body region 28b.

Furthermore, by increasing the positive hole carrier concentration at the boundary surface 29 between the semiconductor region 52 and the body region 28b, the positive hole carrier concentration at a boundary surface 27 between the body region 28b and the drift region 26 can also be increased by a great deal compared to the conventional configuration. Specifically, the positive hole carriers accumulate at $8\times10^{15}$ cm$^{-3}$ or greater at the boundary surface 27 between the body region 28b and the drift region 26. With the IGBT 11, it is possible to obtain the effect of increasing the positive hole carrier concentration even at the boundary surface between the body region and the drift region, this being the location with the conventional configuration where there is the greatest fall in positive hole carrier concentration. As a result, with the IGBT 11, since it is possible to increase the positive hole carrier concentration at both the drift region 26 and the body region 28b, the on-voltage can be greatly reduced. Further, the positive hole carrier concentration when the IGBT 11 is on can be found by calculating the shape, impurity concentration, etc. of the constituting elements. This can be found utilizing, for example, the device simulator DESSIS from Synopsys, or the like.

The insulator films 64 of the second electrodes 62 of the IGBT 11 are formed away from the emitter regions 32. As a result, the electron carriers are not injected along the second electrodes 62. It might be thought that there is a close relationship between an increase in the supply amount of electron carriers and an increase in the saturation current value of the IGBT. In the present embodiment, however, there is substantially no increase in the supply amount of electron carriers despite the formation of the second electrodes 62. There is no increase in the area of the emitter electrodes 32 if the pitch width of the trench gate electrodes 42 is set to be the same as the pitch width in the conventional configuration. As a result, the situation is avoided wherein the saturation current value increases excessively. Since the latch up phenomenon can be prevented from occurring, breakdown of the IGBT is avoided.

With the IGBT 11, an example was given where the semiconductor region 52 makes contact with the gate insulator films 44 at left and right sides with respect to the plane of the paper. However, the amount of accumulation of the positive carriers in the semiconductor region can be increased and the on-voltage can be decreased in the case, also, where the semiconductor region 52 is away from the gate insulator films 44.

Furthermore, another characteristic of the IGBT 11 is its ability to be utilized when the impurity concentration of the floating semiconductor region 52 is lower than the impurity concentration of the conventional configuration. In the conventional configuration, the amount of positive carriers accumulated decreases when the semiconductor region 52 has a low impurity concentration, and the on-voltage is not reduced. Meanwhile, if the impurity concentration of the semiconductor region 52 is increased to increase the amount of accumulation of the positive carriers, the latch up phenomenon occurs, and turn off becomes impossible.

In the present embodiment, the accumulation of the positive hole carriers is the same along a wide range of the semiconductor region 52 even when the semiconductor region 52 has a low impurity concentration, and consequently the on-voltage can be reduced. Further, due to the low concentration, the occurrence of the latch up phenomenon can be controlled. If the impurity concentration is $1 \times 10^{17}$ cm$^{-3}$ or below, the on-voltage can be reduced without the latch up phenomenon occurring.

Further, when turned off, the second electrodes 62 of the IGBT 11 can bring the potential of the floating semiconductor region 52 to the neighborhood of 0V. As a result, a reliable turn off operation can be realized.

Variant of the First Embodiment

Figure 3:
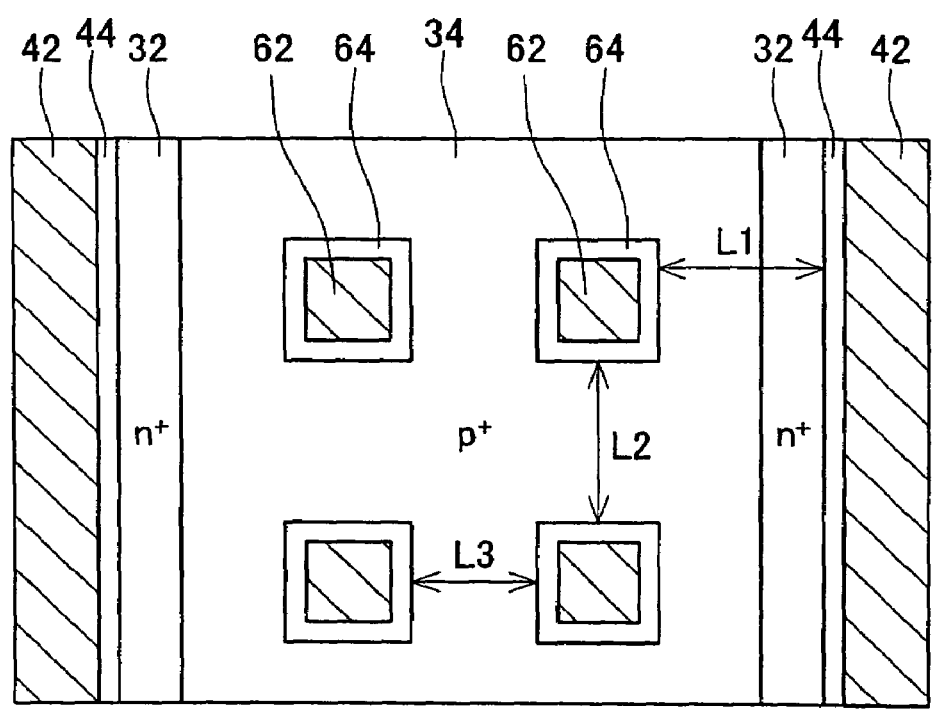
FIG. 3 schematically shows a plan surface pattern of a variant IGBT of the first embodiment.

FIG. 3 schematically shows a plan surface pattern of an IGBT of a variant of the first embodiment. As shown in FIG. 2, the IGBT 11 of the first embodiment has a striped shape in which the second electrodes 62 and the trench gate electrodes 42 extend in a parallel manner. In the variant, however, the second electrodes 62 are formed in a dotted shape. The shape and positional relationship of the second electrodes 62 is adjusted such that a distance L1 between the insulator film 64 of one of the second electrodes 62 and the gate insulator film 44 is substantially the same as distances L2 and L3 to facing second electrodes 62. More specifically, the shape and positional relationship of the second electrodes 62 is adjusted such that the distance from an arbitrary position of the floating semiconductor region 52 (not shown) to an adjacent gate insulator film 44 or the distance to the insulator film 64 of the second electrode 62 is smaller than a predetermined value. Here, the predetermined value is a distance in a range that allows the following: the floating potential is raised at the arbitrary position of the floating semiconductor region 52 following the application of gate on-voltage to the trench gate electrodes 42 and the second electrodes 62, and a potential barrier to the positive hole carriers can be formed. The positive hole carriers can thus accumulate along a wide range of the floating semiconductor region 52, and the on-voltage can be reduced.

Further, when the second electrodes 62 are formed in a dotted shape it is more possible to prevent an increase in the insulator films 64 covering the second electrodes 62 than in the case where the second electrodes 62 are formed in the striped shape. It is consequently possible to control an increase in the gate-collector capacity that is based on the increase in the insulator films 64. There is thus no deterioration in switching characteristics in spite of the second electrodes 62 being provided, and the on-voltage can be reduced effectively.

Second Embodiment

Figure 4:
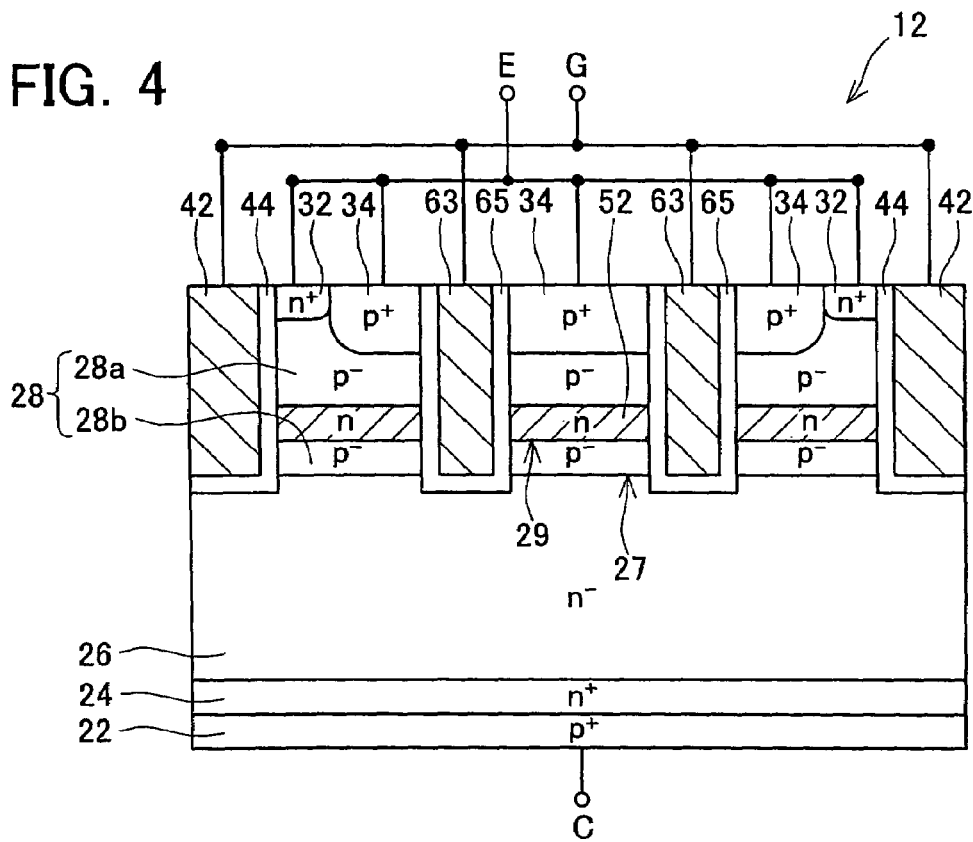
FIG. 4 schematically shows a cross-sectional view of essential parts of an IGBT of a second embodiment.

FIG. 4 schematically shows a cross-sectional view of an IGBT 12 of a second embodiment. Where the configuration is the same as the first embodiment the same numbers are applied thereto and a description thereof is omitted.

The IGBT 12 is characterized in that second electrodes 63 reach the drift region 26. As a result, the second electrodes 63 face, via an insulator film 65, a part of the body region 28b that separates the floating semiconductor region 52 and the drift region 26. Further, the second electrodes 63 do not separate the semiconductor region 52 that extends in the left-right direction of the plane of the paper. The semiconductor region 52 is continuous along a cross-sectional plane (not shown). Specifically, the second electrodes 63, for example, are formed at discrete intervals in a direction perpendicular to the plane of the paper, and the semiconductor region 52 is formed continuously between these discrete intervals.

When the IGBT 12 is turned on, the floating potential of the semiconductor region 52, which is in a floating state, is increased, positive hole carriers accumulate at a boundary surface between the semiconductor region 52 and the body region 28b, and the on-voltage is reduced. Furthermore, locations facing the second electrodes 63 can be inverted to n type by applying potential to the second electrodes 63, these second electrodes 63 being within the body region 28b that separates the semiconductor region 52 and the drift region 26. Electron carriers that have been injected from the emitter regions 32 and diffused within the semiconductor region 52 are easily injected (there is an increase in the current path line) toward the drift region 26 via these inverted channels (termed second channels. A detailed description thereof is in the third embodiment). As a result, the on-voltage of the IGBT 12 is reduced. The electron carriers diffused within the semiconductor region 52 are easily injected toward the drift region 26 utilizing the second channels, and the concentration of the electron carriers diffused within the semiconductor region 52 also increases. When the concentration of the electron carriers in the semiconductor region 52 increases, the concentration of the positive hole carriers accumulated at the boundary surface 29 between the semiconductor region 52 and the body region 28b also increases in response. The on-voltage of the IGBT 12 is consequently greatly reduced.

A bottom face of the second electrodes 63 of the present embodiment is formed near a top face of the drift region 26. As a result, positive hole carriers can be physically accumulated by the bottom face of the second electrodes 63. There is usually a marked reduction in the concentration of positive hole carriers near the boundary surface between the body region 28b and the drift region 26. However, with the present embodiment, it is possible to increase the positive hole carrier concentration at this location. Providing the second electrodes 63 causes an increase by at least one decimal point in the concentration of positive hole carriers near the boundary surface between the body region 28b and the drift region 26 compared to the case where the second electrodes 63 are not provided. Specifically, the positive hole carrier concentration is $2 \times 10^{15}$ cm$^{-3}$~$8 \times 10^{15}$ cm$^{-3}$ when the second electrodes 63 are not provided, and this is increased to $8 \times 10^{16}$ cm$^{-3}$ by providing the second electrodes 63. There is an extremely great reduction of on-voltage in the present embodiment.

The present embodiment is also advantageous where manufacture is concerned. The second electrodes 63 and the trench gate electrodes 42 have the same depth, and consequently the two can be formed utilized the same manufacturing step. For example, the second electrodes 63 and the trench gate electrodes 42 can be formed simultaneously if anisotropic trenches are formed from a surface of the semiconductor substrate by reactant ion etching. If a mask is utilized wherein trench width, intervals between the trenches, etc. is suitably adjusted, the second electrodes 63 and the trench gate electrodes 42 can be formed without increasing the number of steps. The IGBT 12 of the present embodiment can be realized simply by utilizing the same manufacturing steps as the conventional case.

With the IGBT 12, as well, it is possible to control an increase in the gate-collector capacity by forming the second electrodes 63 in a dotted shape. A structure may be adopted in which deterioration in switching characteristics is prevented.

Variant 1 of the Second Embodiment

Figure 5:
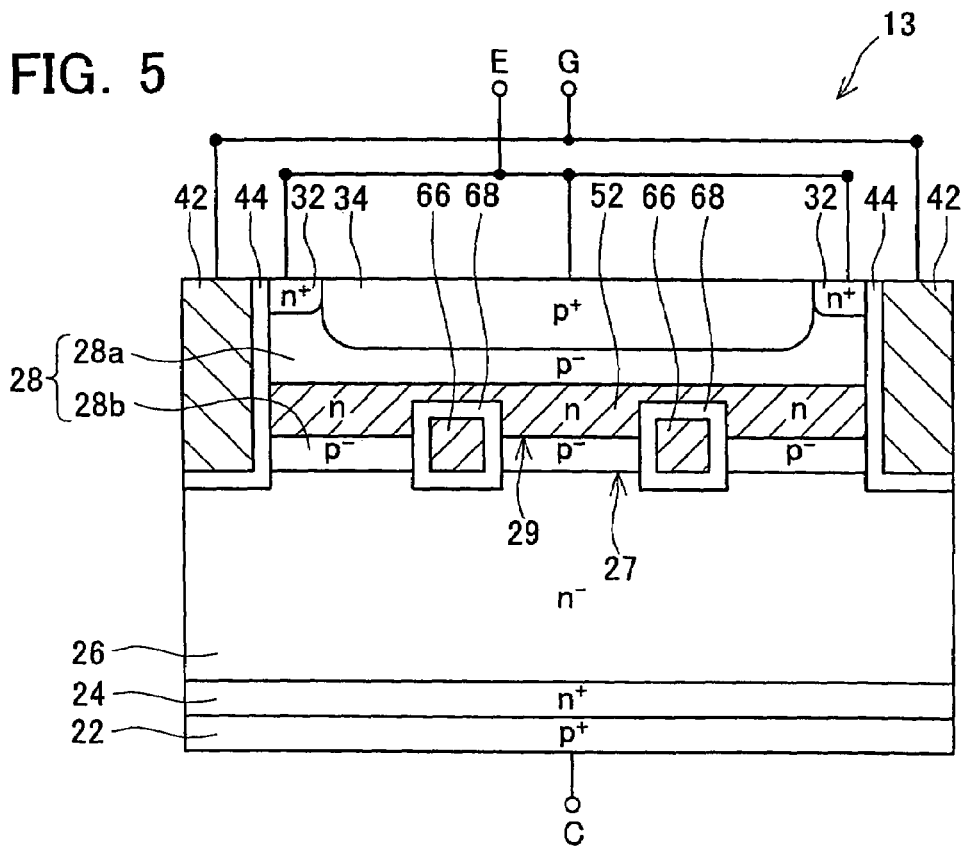
FIG. 5 schematically shows a cross-sectional view of essential parts of a variant 1 of the second embodiment.

FIG. 5 schematically shows a cross-sectional view of essential parts of an IGBT 13 that is a variant of the second embodiment.

As shown in FIG. 5, second electrodes 66 do not extend from the surface of the semiconductor substrate. The second electrodes 66 are embedded within the semiconductor substrate. Each second electrode 66 faces the floating semiconductor region 52 via an insulator film 68. The second electrode 66 also faces the portion of the body region 28b that separates the semiconductor region 52 and the drift region 26. As with the above embodiment, therefore, it is possible to increase the accumulation of positive hole carriers and the injection of electron carriers, and the on-voltage can be markedly reduced. With the IGBT 13, the body contact region 34 can be kept wide, and consequently the discharge of the positive hole carriers can occur rapidly when the IGBT 13 is turned off. The IGBT 13 has a rapid switching speed, and consequently has utility.

Furthermore, it is preferred that at least a part of the second electrodes 66 extends to the surface of the semiconductor substrate in order for voltage to be applied to these second electrodes 66. This is shown schematically in the perspective view of essential parts of FIG. 6. The front surface in FIG. 6 corresponds to the cross-section of FIG. 5. Further, an upper part of the right surface of FIG. 6 is shown as a cut-away view.

Figure 6:
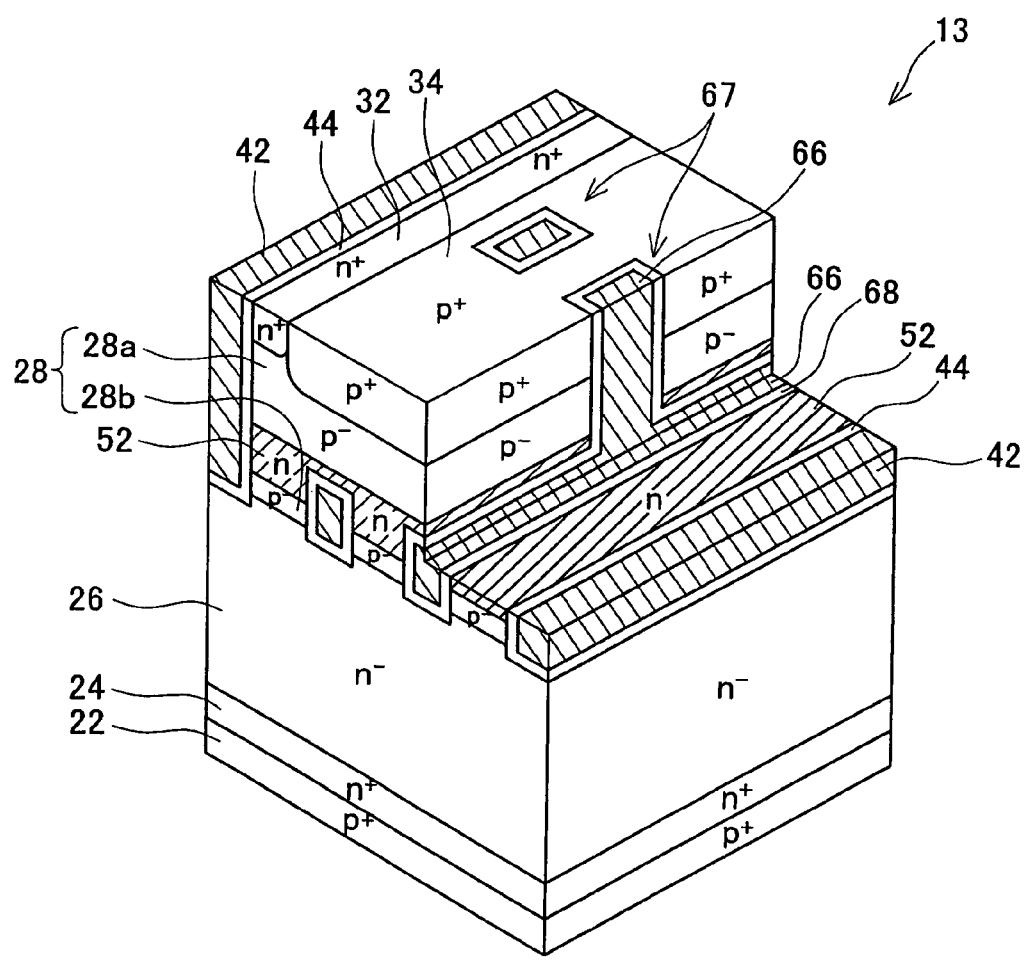
FIG. 6 schematically shows a perspective view of essential parts of the variant 1 of the second embodiment.

As shown in FIG. 6, at least a part of the second electrodes 66 (in this perspective view this is a part located toward the interior of the semiconductor substrate) extends so as to pass through the body region 28a and the body contact region 34. The second electrodes 66 are electrically connected to the trench gate electrodes 42 at locations (represented by the number 67) that are exposed at the surface of the semiconductor substrate. As a result, a voltage common with the voltage of the trench gate electrodes 42 is applied to the second electrodes 66. The second electrodes 66 are thus turned on following the IGBT being turned on, and the on-voltage can be reduced.

Furthermore, the shape adopted for the second electrodes 66 can markedly reduce the amount of increase of the insulator films 68 that cover the second electrodes 66. With the IGBT 13, therefore, it is possible to markedly control an increase in the gate-collector capacity caused by an increase of the insulator films 68 covering the second electrodes 66. There is consequently no deterioration in switching characteristics due to the second electrodes 66 being provided, and the on-voltage can be reduced effectively.

Variant 2 of the Second Embodiment

Figure 7:
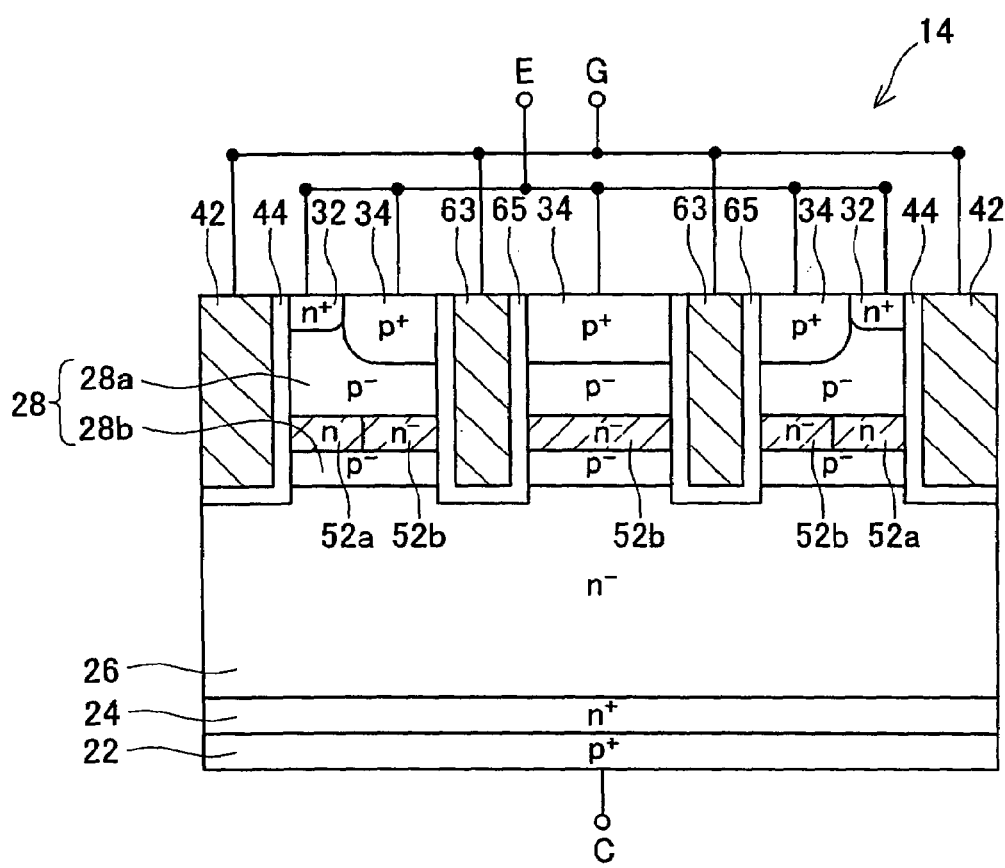
FIG. 7 schematically shows a cross-sectional view of essential parts of a variant 2 of the second embodiment.

FIG. 7 schematically shows a cross-sectional view of essential parts of an IGBT 14 that is another variant of the second embodiment.

In the IGBT 14, the impurity concentration of the semiconductor region 52 differs along a plane that is orthogonal to the direction in which the emitter regions 32 and the drift region 26 are joined (from top to bottom relative to the page). The semiconductor region 52 comprises a high concentration part 52a and a low concentration part 52b. The high concentration part 52a is located between the emitter region 32 and the drift region 26. The low concentration part 52b is located between the body contact region 34 and the drift region 26.

Due to the low concentration part 52b being provided, the positive hole carriers that have accumulated can be discharged rapidly utilizing the low concentration part 52b when the IGBT 14 has been turned off. Furthermore, the positional relationship of the low concentration part 52b and the body contact region 34 is the same above and below, and consequently the positive hole carriers that are being discharged utilizing the low concentration part 52b do not flow into the emitter regions 32, and the positive hole carriers can be discharged rapidly to the emitter electrode E via the body contact region 34. The occurrence of the latch up phenomenon can thus be controlled, while the turn off characteristics of the IGBT 14 are improved.

Moreover, although the low concentration part 52b is provided, the accumulation effect of the positive hole carriers caused by the second electrodes 63 allows a low on-voltage to be obtained.

Third Embodiment

Figure 8:
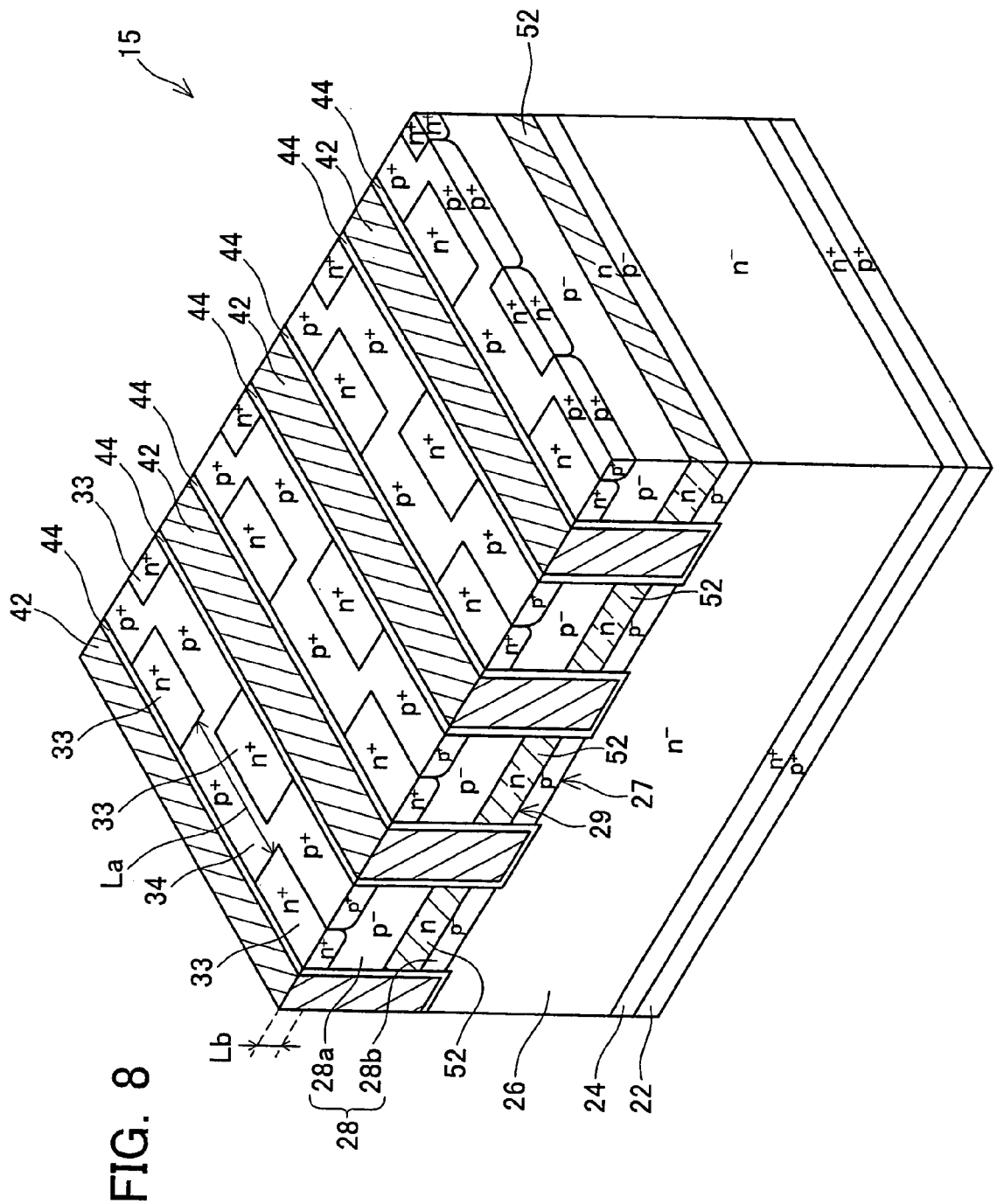
FIG. 8 schematically shows a perspective view of essential parts of a third embodiment.

FIG. 8 schematically shows a perspective view of an IGBT 15 of a third embodiment.

With the IGBT 15, the area that emitter regions 33 occupy on a semiconductor substrate surface is restricted in order to reduce the on-voltage while maintaining a low saturation current value. Here, the area of the emitter regions 33 refers to neighboring portions thereof that are adjacent to the gate insulator films 44. More specifically, the area of the emitter regions 33 refers to the area of a range of the emitter regions 33 that corresponds to the channel regions formed directly below the body region 28 when gate on-voltage is applied to the trench gate electrodes 42. Although the size of the channel regions varies according to the gate on-voltage, the channel regions are generally in a range within 0.1 μm from a side surface of the gate insulator film 44. As a result, the area of the emitter regions 33 is present in the range within 0.1 μm from the side surface of the gate insulator film 44. With the IGBT 15, the proportion of the area occupied by the region between the trench gate electrodes 42 is restricted. As will be described later, it is often possible to reduce contact resistance with the emitter electrode E by the following means: instead of restricting the area of the emitter regions 33, the range thereof that does not correspond to the channel regions is kept wide.

The emitter regions 33 make contact with the gate insulator films 44 at discrete intervals on the semiconductor substrate surface. The emitter regions 33 make contact with the gate insulator films 44 at discrete intervals along the direction in which the trench gate electrodes 42 extend (a lengthwise direction). A width La between the emitter regions 33 is adjusted to be in the range of 1~10 μm. A depth Lb of the emitter regions 33 is adjusted to be in the range of 0.1~1 μm.

Because the emitter regions 33 are provided at discrete intervals it is possible to adjust the pitch width of the trench gate electrodes 42 without increasing the area that the emitter regions 33 occupy on the semiconductor substrate surface (as stated above, this refers to the area of a range corresponding to the channel regions). The area of the emitter regions 33 can be maintained at a predetermined amount even if the pitch width of the trench gate electrodes 42 is adjusted to be narrower. It is thus possible, by adjusting the pitch width of the trench gate electrodes 42 to be narrower without increasing the area of the emitter regions 33, to increase the positive hole carrier accumulation capacity of the semiconductor region 52 while preventing a reduction in the amount of electron carriers supplied from the emitter regions 33. When the positive hole carrier accumulation capacity of the semiconductor region 52 is increased, a large amount of positive hole carriers can accumulate at a boundary surface 29 between the semiconductor region 52 and the body region 28b. Furthermore, a large amount of positive hole carriers can also accumulate at the boundary surface 27 between the body region 28b and a drift region 26 due to there being a large amount of positive hole carriers accumulated at the boundary surface 29 between the semiconductor region 52 and the body region 28b. The on-voltage of the IGBT 15 can thus be markedly reduced. Further, it is possible to keep the amount of electron carriers supplied low when the width La of the intervals between the emitter regions 33 is adjusted to be in a range of 1 µm or above. Since there is the fear of worsening channel resistance when the width La between the emitter regions 33 is too great, it is preferred that the width La of the intervals between the emitter regions 33 is adjusted to a range within 10 µm. When the depth Lb of the emitter regions 33 is adjusted to be in the range of 0.1~1 µm, the electron carrier supply capacity of the emitter regions 33 is reduced, and consequently the amount of electron carriers supplied can be kept low.

With the IGBT 15, the on-voltage can be reduced due to an increase in the amount of positive hole carriers accumulated while the destruction of the IGBT 15 caused by an increase in saturation current value is being prevented.

Furthermore, the area of the emitter regions 33 strongly influences the saturation current value. The area of the floating semiconductor region 52 (the area within a plane orthogonal to the direction in which the emitter regions 33 and the drift region 26 are joined) strongly influences the amount of positive hole carriers accumulated. With an IGBT having these two characteristics it is possible to establish a relationship between the area of the emitter regions 33 and the area of the floating semiconductor region 52. That is, it is preferred that the area of the emitter regions 33 is 50% or less the area of the floating semiconductor region 52. It is more preferred that the area is in the range of 10~30%. In this case, destruction caused by an increase in saturation current value can be prevented, and an IGBT with extremely small on-voltage can be obtained. Further, although the optimum values vary according to chip size, the number and shape of trench gate electrodes, etc., an IGBT with outstanding characteristics can generally be obtained by adjusting the ranges to be within the numerical values mentioned above.

Furthermore, with the IGBT 15, a measure to decrease channel resistance is also executed. The emitter regions 33 are not formed so as to face one another in a direction orthogonal to the lengthwise direction of the trench gate electrodes 42. In a direction opposite where a face of the emitter region 33 makes direct contact with the gate insulator film 44 of a first trench gate electrode 42 this emitter region 33 does not make contact with the gate insulator film 44 of a second trench gate electrode 42. That is, an emitter region 33 making contact with the gate insulator film 44 of a first trench gate electrode 42 does not make contact with the gate insulator film 44 of a second trench gate electrode 42. Further, the emitter regions 33 are formed in a repeating manner in the IGBT 15. The emitter regions 33 making contact with the gate insulator film 44 of a first trench gate electrode 42 are formed in a repeating manner, and the emitter regions 33 making contact with the gate insulator film 44 of a second trench gate electrode 42 are formed in a repeating manner. The set of first emitter regions 33 and the set of second emitter regions 33 are formed alternately with respect to the direction in which they are formed repeatedly. In this case, the pattern of the emitter regions 33 on the semiconductor substrate surface is a lattice shape (or checkered shape) between facing trench gate electrodes 42.

Figure 9:
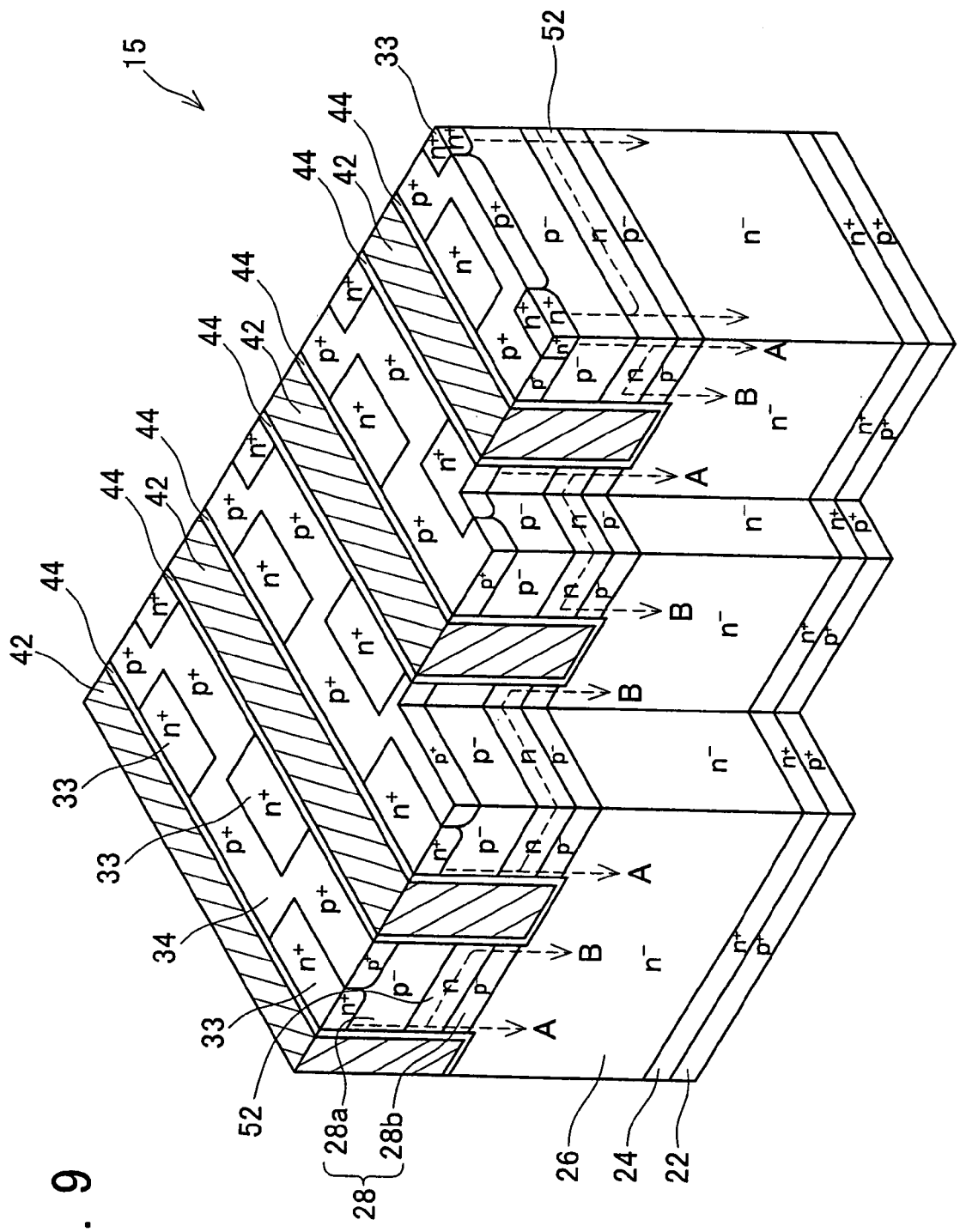
FIG. 9 shows flow paths of electron carriers of the third embodiment.

FIG. 9 shows a flow path of electron carriers supplied from the emitter regions 33. It should be noted that a part of the IGBT 15 has been cut away.

The electron carriers supplied from the emitter regions 33 flow to the drift region 26 along the following path. First, the electron carriers supplied from the emitter regions 33 flow along the gate insulator films 44 to the semiconductor region 52. Here a portion of the electron carriers passes through the semiconductor region 52 and flows along the gate insulator films 44 to the drift region 26 (the direction of the arrows A: termed first channels). The other portion of the electron carriers diffuses within the semiconductor region 52 and flows along the gate insulator film 44 of the facing trench gate electrode 42 to the drift region 26 (the direction of the arrows B: termed second channels). That is, although the amount of electron carriers supplied is controlled by the area of the emitter regions 33 that have a restricted area, the supplied electron carriers can flow across a wide range utilizing the semiconductor region 52 and the facing trench gate electrodes 42. It is possible, while the supplied electron carriers are flowing, to keep channel resistance low while simultaneously restricting the amount of electron carriers supplied and keeping the saturation current value low. Channel resistance tends to increase as the channel area is reduced when the emitter regions 33 are formed at discrete intervals. However, in the case of the IGBT 15, the increase in channel resistance can be controlled by utilizing paths along the semiconductor region 52 and the second channels B. In particular, when the emitter regions 33 have parts, in the direction orthogonal to the direction in which the trench gate electrodes 42 extend, that make contact with the gate insulator films 44 and parts that do not make contact with the gate insulator films 44, as is the case with the IGBT 15, the first channels A and the second channels B are utilized in a synergistic manner, and consequently there is outstanding control over the increase in channel resistance. Furthermore, the second channels are used effectively with the IGBT 15, and consequently there is an increase in the concentration of electron carriers diffused within the semiconductor region 52. The concentration of the positive hole carriers at the boundary surface 29 between the semiconductor region 52 and the body region 28b also increases in response to the increase in the amount of electron carriers. The present embodiment is successful in increasing the concentration of positive hole carriers to an amount that cannot be realized with the conventional configuration, i.e. to $8 \times 10^{15}$ cm$^{-3}$ or above.

When the present configuration is utilized, it is possible to control the increase in channel resistance while preventing the destruction of the IGBT 15 caused by an increase in the saturation current value, and an IGBT 15 in which on-voltage has been markedly reduced can be obtained due to the accumulation of the positive hole carriers in the semiconductor region 52.

Variant 1 of the Third Embodiment

Figure 10:
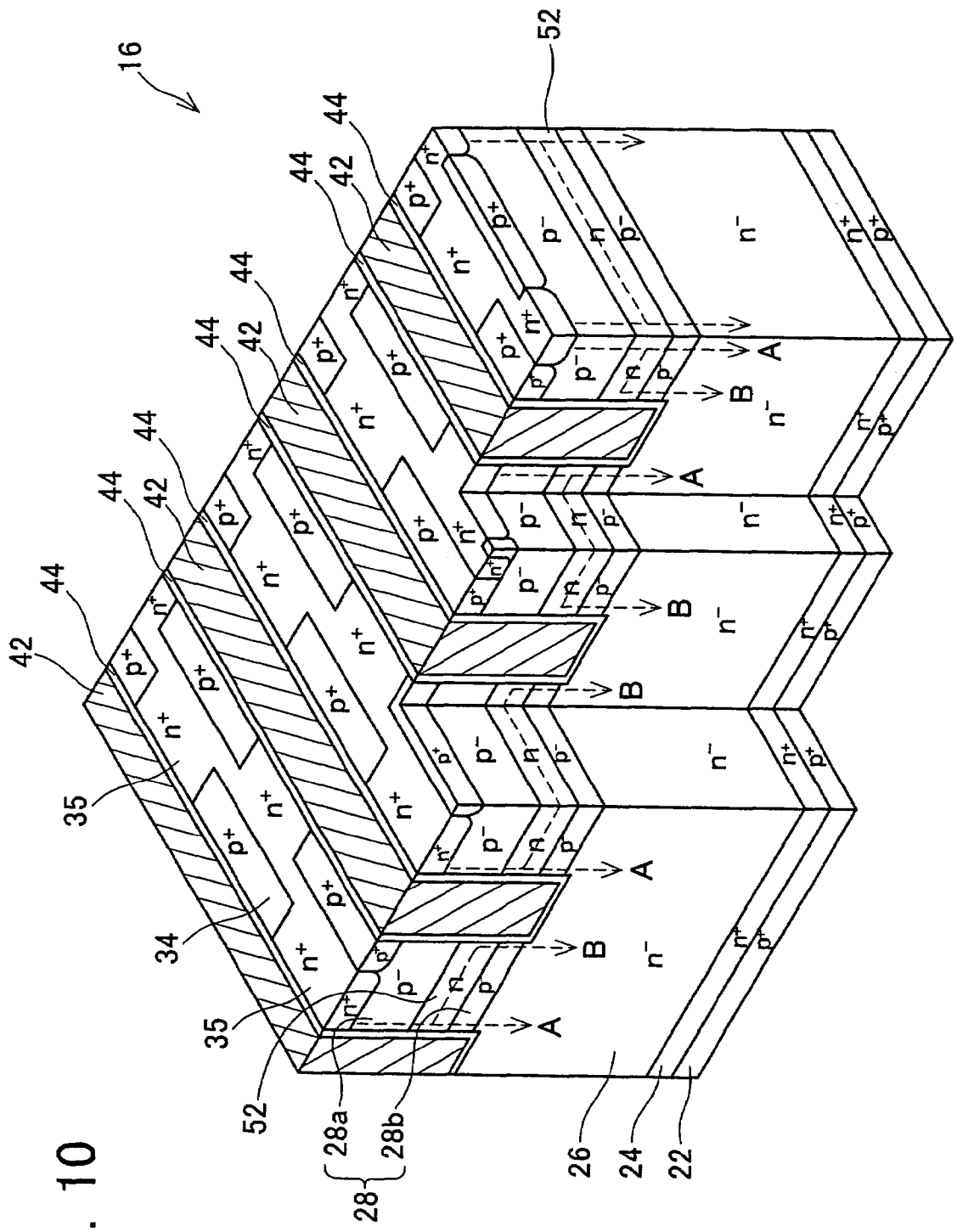
FIG. 10 shows a perspective view of essential parts of a variant 1 of the third embodiment and shows flow paths of electron carriers.

FIG. 10 schematically shows a perspective view of essential parts of an IGBT 16 that is a variant of the third embodiment.

In the IGBT 16, emitter regions 35 join at positions that do not make contact with the gate insulator films 44. Alternatively, the emitter regions 35 join at positions other than a range corresponding to the range of the channel regions.

Portions of the emitter regions 35 not making contact with the gate insulator films 44 do not critically increase a supply amount of the electron carriers. Instead, the contact resistance with the emitter electrode provided on the surface can be reduced. As a result, it is preferred that the portions of the emitter regions 35 not making contact with the gate insulator films 44 maintain a size within a range in which the supply amount of the electron carriers is not critically increased. It is consequently preferred that the emitter regions 35 join at positions that do not make contact with the gate insulator films 44. The contact resistance can thus be reduced, and consequently on-voltage can be reduced.

Variant 2 of the Third Embodiment

Figure 11:
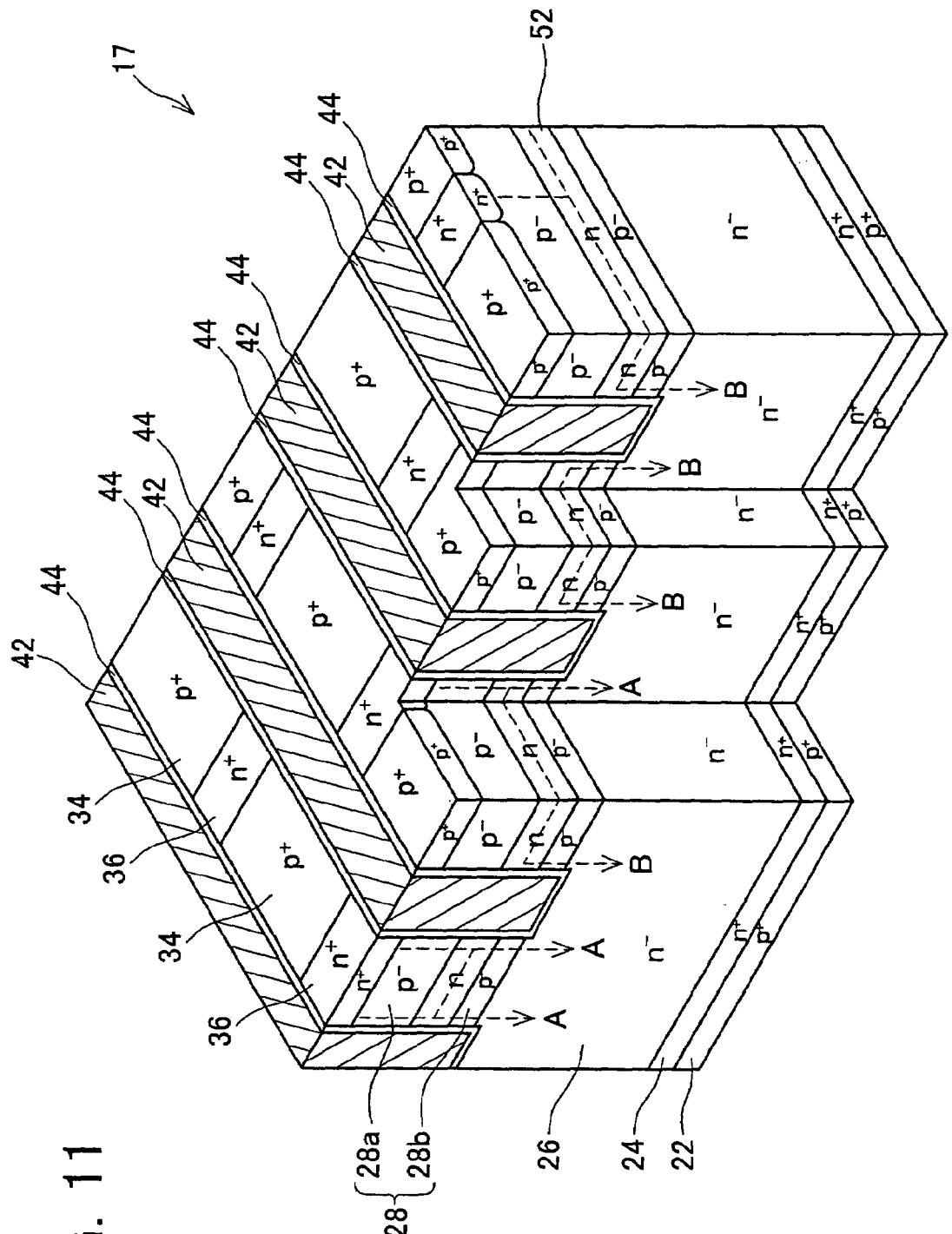
FIG. 11 shows a perspective view of essential parts of a variant 2 of the third embodiment and shows flow paths of electron carriers.

FIG. 11 schematically shows a perspective view of essential parts of an IGBT 17 that is another variant of the third embodiment.

In the IGBT 17, the emitter regions 36 are joined between the facing trench gate electrodes 42. A combination of the emitter region 36 and body contact region 34 is repeated in the direction in which the trench gate electrodes 42 extend.

In the IGBT 17, as well, portions are joined of the emitter regions 36 that do not make contact with the gate insulator films 44 and consequently the contact resistance can be reduced between the emitter regions 35 and the emitter electrode provided on the surface.

Further, in the IGBT 17, the electron carriers supplied from the emitter regions 36 are diffused within the semiconductor region 52 and are injected into the drift region 26. Since the second channels can thus be utilized, the channel resistance can be kept low when the supplied electron carriers are flowing, and consequently an IGBT 17 with markedly reduced on-voltage can be obtained.

Other Variants of the Third Embodiment

Figure 12:
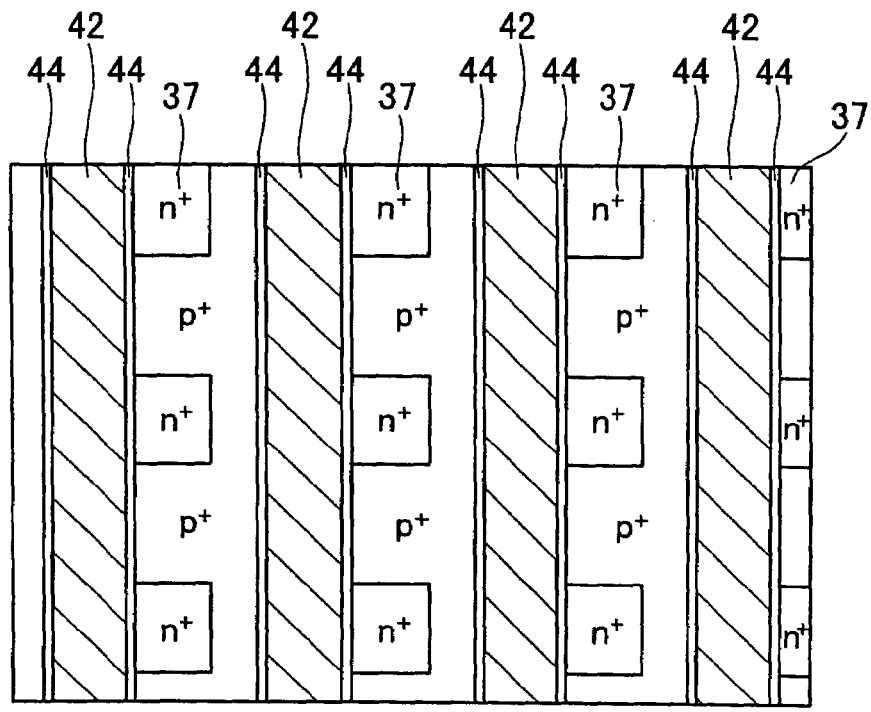
FIG. 12 shows an example of a plan surface pattern of emitter regions of a different variant of the third embodiment.
Figure 13:
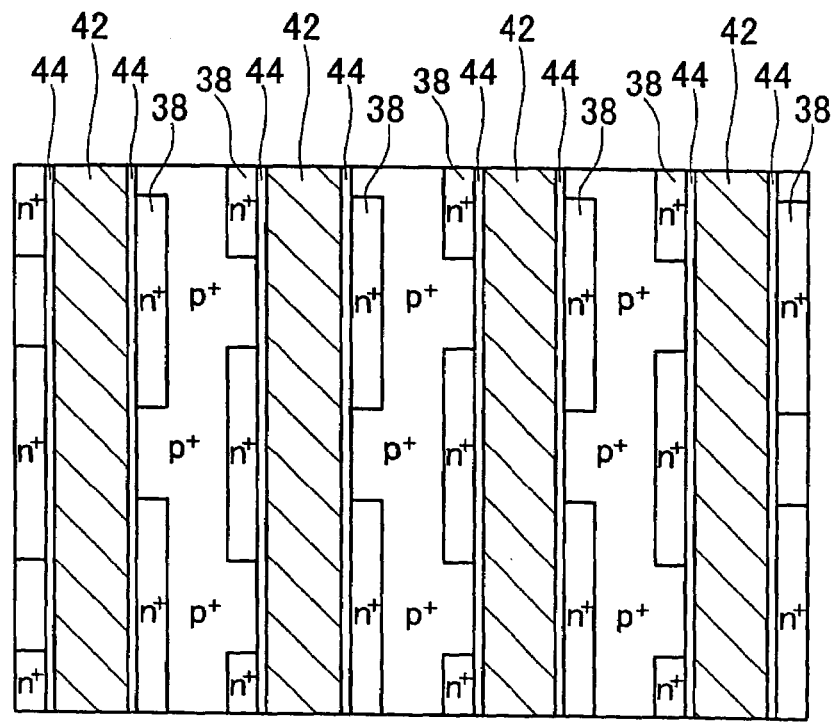
FIG. 13 shows an example of a plan surface pattern of emitter regions of a different variant of the third embodiment.
Figure 14:
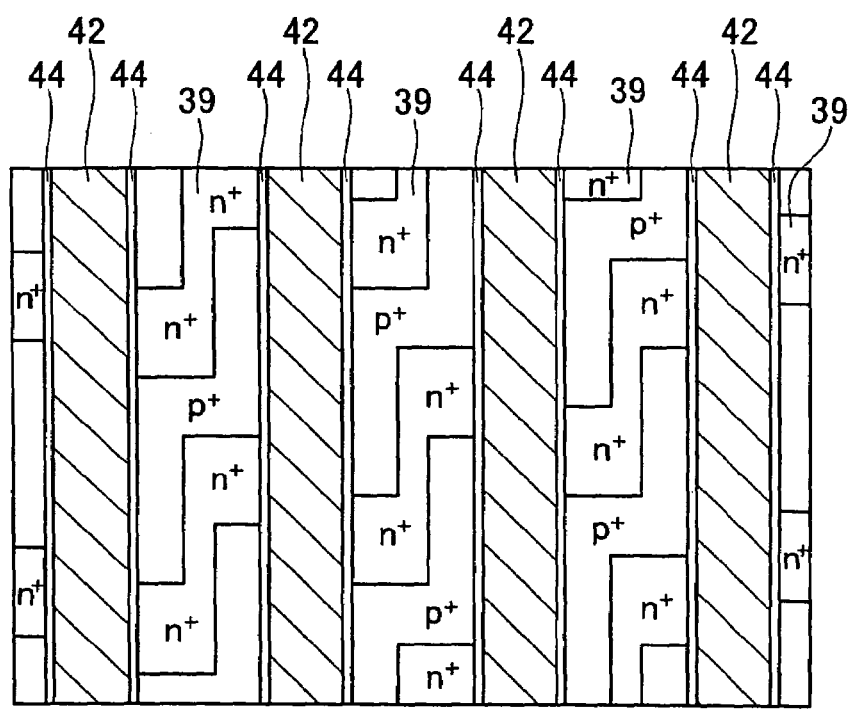
FIG. 14 shows an example of a plan surface pattern of emitter regions of a different variant of the third embodiment.

FIGS. 12, 13, and 14 schematically show plan patterns of other variants of the emitter regions of the third embodiment. Various configurations of plan patterns can be adopted to limit the area of the emitter regions, and configurations other than those shown below can be adopted. If the emitter regions are provided at discrete intervals, the same operation and effects as in the examples given above can be obtained.

In an IGBT of FIG. 12, emitter regions 37 are provided at only one side of a side surface of the trench gate electrodes 42. The emitter regions 37 are not provided so as to make contact with the gate insulator films 44 of the facing trench gate electrodes 42.

In an IGBT of FIG. 13, emitter regions 38 are provided at discrete intervals at the side surfaces of the left and right gate insulator films 44. A part of the emitter regions 38 faces a part of the other emitter region 38 in a direction orthogonal to the direction in which the trench gate electrodes 42 extend. A part of the emitter regions 38 does not face a part of the other emitter region 38 in the direction orthogonal to the direction in which the trench gate electrodes 42 extend.

In an IGBT of FIG. 14, an emitter region 39 making contact with one of the gate insulator films 44 joins with an emitter region 39 making contact with the facing gate insulator films 44. This combination is repeated in the direction in which the trench gate electrodes 42 extend.

Fourth Embodiment

Figure 15:
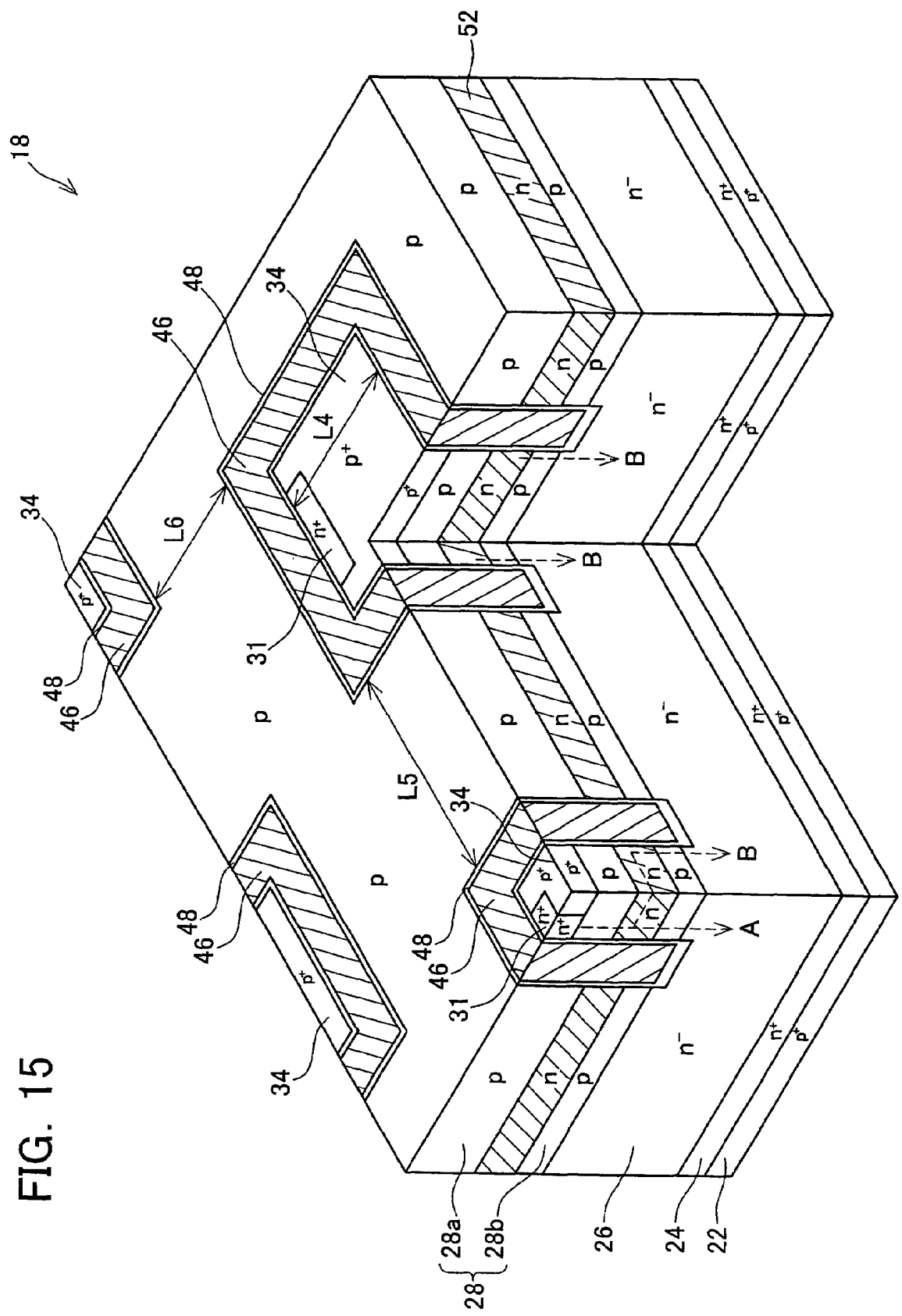
FIG. 15 shows a perspective view of essential parts of a variant 3 of the third embodiment and shows flow paths of electron carriers.

FIG. 15 schematically shows a perspective view of essential parts of an IGBT 18 of a fourth embodiment.

The configuration of the third embodiment and the variants thereof are configurations in which the pitch width of stripe shaped trench gate electrodes is narrow. When this configuration is adopted, there is the concern that switching characteristics will be affected by an increase in the gate-collector capacity based on an increase in the amount of the gate insulator films. With the IGBT 18, a configuration is proposed that offers a countermeasure to this issue.

In the IGBT 18, trench gate electrodes 46 do not have a striped shape, and are formed in a complex pattern. In the IGBT 18, each of the trench gate electrodes 46 forms a loop, and these are formed in a dotted shape on a semiconductor substrate surface. In the IGBT 18, the shape and positional relationship of the trench gate electrodes 46 is adjusted such that a distance L4 from one gate insulator film 48 to a facing gate insulator film 48 within the trench gate electrode 46 that forms a loop is substantially the same as distances L5 and L6 between the gate insulator film 48 of one trench gate electrode 46 and the gate insulator film 48 of another trench gate electrode 46. More specifically, the shape and positional relationship of the trench gate electrodes 46 is adjusted such that the distance from an arbitrary position of the floating semiconductor region 52 to an adjacent gate insulator film 48 is smaller than a predetermined value. Here, the predetermined value is a distance in a range that allows the following: the floating potential is raised at the arbitrary position of the floating semiconductor region 52 following the application of gate on-voltage to the trench gate electrodes 46, and a potential barrier to the positive hole carriers can be formed. The positive hole carriers can thus accumulate along a wide range of the floating semiconductor region 52, and the on-voltage can be reduced.

Further, with this method using the shape and positional relationship of the trench gate electrodes 46 it is more possible to prevent an increase in the gate insulator films 48 than in the case where the trench gate electrodes are formed in the striped shape. It is consequently possible to control an increase in the gate-collector capacity that is caused by the increase in the gate insulator films 48. There is thus no deterioration in switching characteristics in spite of the facing trench gate electrodes 46 being narrow in width, and the on-voltage can be reduced effectively.

Emitter regions 31 are provided within the trench gate electrodes 46 that form a loop. The emitter region 31 makes direct contact with the gate insulator film 44 of the trench gate electrode 46 in one direction, and does not make contact with the gate insulator film 44 of the trench gate electrode 46 in the direction opposite thereto. As a result, within the trench gate electrodes 46 that form a loop, the electron carriers supplied from the emitter regions 31 are supplied in a planar manner toward the drift region 26 utilizing the second channels B. In the IGBT 18, a body contact region 34 is not provided to the exterior of the trench gate electrodes 46 that form a loop. The exterior of the trench gate electrodes 46 that form a loop consequently has a floating state, and the accumulation of positive hole carriers is extremely effective.

Specific examples of the present invention are described above in detail, but these examples are merely illustrative and place no limitation on the scope of the patent claims. The technology described in the patent claims also encompasses various changes and modifications to the specific examples described above.

For example, in the third embodiment, the variant thereof, and the fourth embodiment, a part with a high impurity concentration and a part with a low impurity concentration may be provided in the semiconductor region 52. The positive hole carriers can be discharged utilizing the low concentration part when the device is turned off.

Alternatively, a second electrode may be provided between the trench gate electrodes 42 in the third embodiment and the variant thereof. More positive hole carriers can thus accumulate effectively.

Alternatively, emitter regions 31 may be formed in the range shown by L5 and L6 in the fourth embodiment. More electron carriers can thus be supplied into the elements.

Furthermore, the technical elements explained in the present specification and drawings provide technical value and utility either independently or through various combinations. The present invention is not limited to the combinations described at the time the claims are filed. Further, the purpose of the example illustrated by the present specification and drawings is to satisfy multiple objectives simultaneously, and satisfying any one of those objectives gives technical value and utility to the present invention.

The invention claimed is:

1. An IGBT comprising:
   an emitter region of a first conductive type;
   a body region of a second conductive type, the body region making contact with the emitter region of the first conductive type;
   a drift region of the first conductive type, the drift region making contact with the body region of the second conductive type and being isolated from the emitter region of the first conductive type by the body region of the second conductive type;
   a gate electrode facing the body region of the second conductive type via a gate insulator film, the gate electrode passing through the body region of the second conductive type at a portion separating the emitter region of the first conductive type and the drift region of the first conductive type, and extending from the emitter region of the first conductive type to the drift region of the first conductive type;
   a semiconductor region of the first conductive type having a floating potential, the semiconductor region being formed within the body region of the second conductive type and being isolated from both the emitter region of the first conductive type and the drift region of the first conductive type by the body region of the second conductive type; and
   a second electrode facing at least a part of the semiconductor region of the first conductive type via an insulator film, and not facing the body region of the second conductive type at a portion separating the semiconductor region of the first conductive type and the emitter region of the first conductive type.

2. The IGBT according to claim 1, wherein the semiconductor region of the first conductive type makes contact with the gate insulator film.

3. The IGBT according to claim 2, wherein the second electrode passes through the body region of the second conductive type at a portion separating the semiconductor region of the first conductive type and the drift region of the first conductive type, extends from the semiconductor region of the first conductive type to the drift region of the first conductive type, and faces the body region of the second conductive type via the insulator film.

4. The IGBT according to claim 2, wherein, when the IGBT is on, concentration of carriers of the second conductive type accumulated at a boundary surface is $8 \times 10^{15}$ cm$^{-3}$ or greater, this boundary surface being, within boundary surfaces between the semiconductor region of the first conductive type and the body region, at a side facing the drift region.

5. The IGBT according to claims 1, wherein the second electrode and the gate electrode are electrically connected.

6. The IGBT according to claims 1, wherein the impurity concentration of the semiconductor region of the first conductive type is $1 \times 10^{17}$ cm$^{-3}$ or less.

7. The IGBT according to claims 1, wherein the impurity concentration of the semiconductor region of the first conductive type varies within a plane orthogonal to a direction extending from the emitter region of the first conductive type towards the drift region of the first conductive type.

8. The IGBT according to claim 7, wherein a high impurity concentration part of the semiconductor region of the first conductive type is located between the emitter region of the first conductive type and the drift region of the first conductive type, and a low impurity concentration part of the semiconductor region of the first conductive type is located between the drift region of the first conductive type and a surface of the body region of the second conductive type wherein the emitter region of the first conductive type is not formed.

* * * * *